United States Patent
Schneider et al.

(10) Patent No.: US 10,505,095 B2
(45) Date of Patent: Dec. 10, 2019

(54) NEURAL MEMBER, NEURAL NETWORK, AND NEUROLOGICAL MEMORY

(71) Applicant: Government of the United States of America, as Represented by the Secretary of Commerce, Gaithersburg, MD (US)

(72) Inventors: Michael Schneider, Superior, CO (US); Stephen Russek, Louisville, CO (US); William Rippard, Boulder, CO (US); Matthew Pufall, Boulder, CO (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 36 days.

(21) Appl. No.: 15/722,508

(22) Filed: Jan. 4, 2018

(65) Prior Publication Data
US 2019/0207076 A1    Jul. 4, 2019

(51) Int. Cl.
H01L 39/22 (2006.01)
H01L 39/16 (2006.01)
G06N 3/04 (2006.01)
H01L 39/02 (2006.01)
H01L 39/24 (2006.01)

(52) U.S. Cl.
CPC .............. *H01L 39/223* (2013.01); *G06N 3/04* (2013.01); *H01L 39/025* (2013.01); *H01L 39/16* (2013.01); *H01L 39/221* (2013.01); *H01L 39/2493* (2013.01)

(58) Field of Classification Search
CPC ...... H01L 39/223; H01L 39/025; H01L 39/16; H01L 39/221; H01L 39/2493
See application file for complete search history.

(56) References Cited

U.S. PATENT DOCUMENTS

| | | |
|---|---|---|
| 3,599,009 A | 8/1971 | Parmentier et al. |
| 5,111,082 A | 5/1992 | Harada |
| 5,172,204 A | 12/1992 | Hartstein |
| 8,270,209 B2 | 9/2012 | Herr et al. |

(Continued)

OTHER PUBLICATIONS

Yokoyama et al. "Josephson effect through magnetic skyrmions," Phys. Rev. B 92 060603(R) 2015 (Year: 2015).*

(Continued)

*Primary Examiner* — Matthew L Reames
(74) *Attorney, Agent, or Firm* — Office of Chief Counsel for National Institute of Standards and Technology

(57) ABSTRACT

A neural member includes: an axonal superconducting electrode; a dendritical superconducting electrode disposed opposing the axonal superconducting electrode; a synaptic barrier interposed between the axonal superconducting electrode and the dendritical superconducting electrode and including a plurality of magnetic clusters, the synaptic barrier being a tunable magnetic barrier between an ordered magnetic state and a disordered magnetic state such that: the axonal superconducting electrode, the dendritical superconducting electrode, and the synaptic barrier are arranged as a dynamically reconfigurable Josephson junction.

14 Claims, 18 Drawing Sheets

(56) References Cited

U.S. PATENT DOCUMENTS

2017/0364801 A1* 12/2017 Kim ................. G06N 3/049

OTHER PUBLICATIONS

Li, Sai, "Magnetic skyrmion-based artificial neuron device," Nanotechnology 28 31LT01 Jul. 2017 (Year: 2017).*

Russek et al. "Stochastic Single Flux Quantum Neuromorphic Computing using Magnetically Tunable Josephson Junctions," IEEE 2016 International Conference on Rebooting Computing (ICRC) Oct. 17-19, 2016 date added to IEEE XPlore Nov. 10, 2016 (Year: 2016).*

Baek, B., et al., Magnetic barrier structures for superconducting-magnetic hybrid Josephson junctions, IEEE 14th International Superconductive Electronics Conference (ISEC), 2013.

Wu, X., et al., Simulating electric activities of neurons by using PSPICE, Nonlinear Dynamics, 2014, p. 113-126, 75.

Hirose T., et al., Pulsed neural networks consisting of single-flux-quantum spiking neurons, Physica C-Superconductivity and Its Applications, 2007, p. 1072-1075.

Onomi, T., et al., High-speed single flux-quantum up/down counter for neural computation using stochastic logic, 8th European Conference on Applied Superconductivity, 2008.

Onomi, T., et al., Neuron Circuit Using Coupled SQUIDs Gate with Flat Output Characteristics for Superconducting Neural Network, IEICE Transactions on Electronics, 2014, p. 173-177, vol. E97-C No. 3.

Onomi, T., et al., An improved superconducting neural circuit and its application for a neural network solving a combinatorial optimization problem, 11th European Conference on Applied Superconductivity, 2014.

Yamanashi, Y., et al., Pseudo Sigmoid Function Generator for a Superconductive Neural Network, IEEE Transactions on Applied Superconductivity, 2013, vol. 23 No. 3.

* cited by examiner

NEURAL MEMBER, NEURAL NETWORK, AND NEUROLOGICAL MEMORY

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov; reference NIST Docket Number 17-036US1.

BRIEF DESCRIPTION

Disclosed is a neural member comprising: an axonal superconducting electrode; a dendritical superconducting electrode disposed opposing the axonal superconducting electrode; a synaptic barrier interposed between the axonal superconducting electrode and the dendritical superconducting electrode and comprising a plurality of magnetic clusters, the synaptic barrier being a tunable magnetic barrier between an ordered magnetic state and a disordered magnetic state such that: the axonal superconducting electrode, the dendritical superconducting electrode, and the synaptic barrier are arranged as a dynamically reconfigurable Josephson junction.

Also disclosed is a neural network comprising: a neural member; and a first electrical pulser in electrical communication with a dendritical superconducting electrode of the neural member and that provides the electrical state pulse to the dendritical superconducting electrode.

Further disclosed is a neurological memory comprising: a neural member; and an electrical current source in electrical communication with a synaptic barrier of the neural member and that provides a write pulse to the synaptic barrier.

Also disclosed is a process for training a neural member, the process comprising: subjecting a synaptic barrier of the neural member to a magnetic field, the synaptic member being in a disordered magnetic state, and the neural member comprising: an axonal superconducting electrode; a dendritical superconducting electrode disposed opposing the axonal superconducting electrode; a synaptic barrier interposed between the axonal superconducting electrode and the dendritical superconducting electrode and comprising a plurality of magnetic clusters, the synaptic barrier being a tunable magnetic barrier between an ordered magnetic state and a disordered magnetic state such that: the axonal superconducting electrode, the dendritical superconducting electrode, and the synaptic barrier are arranged as a dynamically reconfigurable Josephson junction; subjecting the synaptic barrier to a first electrical state pulse; changing from the disordered magnetic state to an ordered magnetic state in the synaptic barrier in response to the first electrical state pulse in presence of the magnetic field; maintaining the ordered magnetic state in the synaptic barrier in an absence of the electrical state pulse; subjecting the synaptic barrier to a second electrical pulse in an absence of the magnetic field; and changing from the ordered magnetic state to the disordered magnetic state in the synaptic barrier in response to the second electrical state pulse in the absence of the magnetic field to train the neural member.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments is presented herein by way of exemplification and not limitation.

Advantageously and unexpectedly, it has been discovered that a neural member herein provides a tunable spiking neural element for neural network type computations. The neural member can be an artificial synapse, a threshold neuron, or, through an plurality of such members, a network. Moreover, the neural member can include a dynamically reconfigurable superconducting Josephson junction with magnetic clusters in a synaptic barrier. A spiking energy per pulse can vary with the magnetic configuration. Critical current of the magnetic Josephson junction provides synaptic weight and can be tuned using electrical state pulse as and input voltage spike to change a magnetic spin order of the magnetic clusters in the synaptic barrier. Beneficially, the neural member can operate in a stochastic regime, wherein spiking energy of the neural member is comparable to thermal energy.

Figure 1:
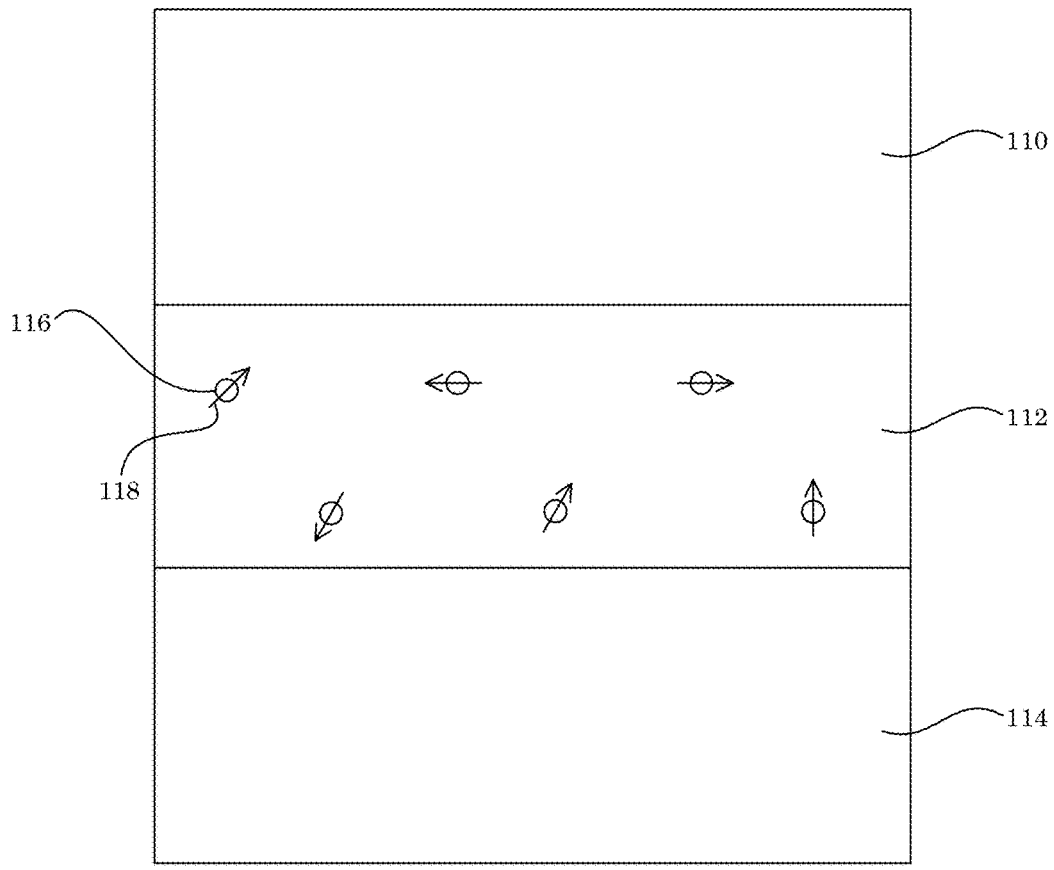
FIG. 1 shows a neural member.
Figure 3:
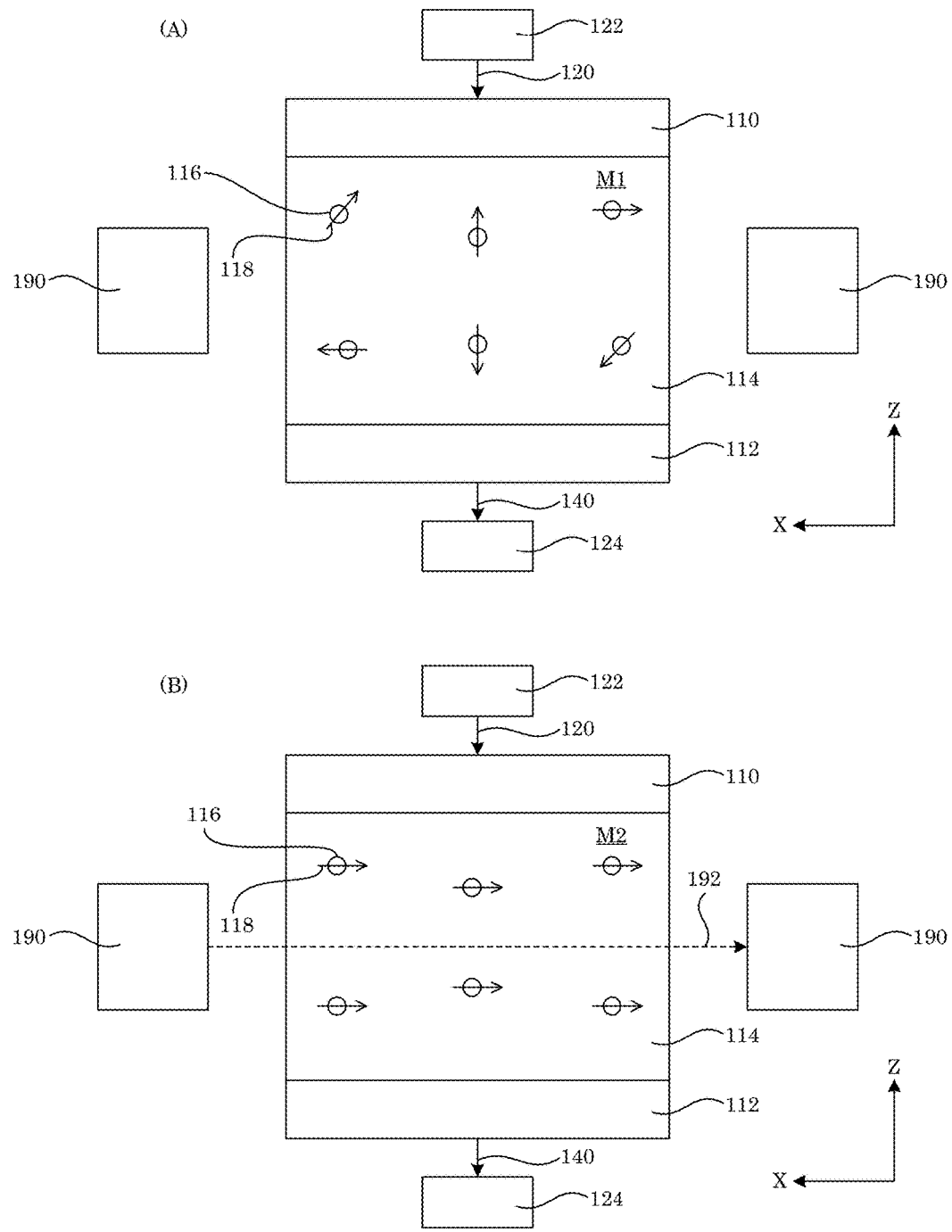
FIG. 3 shows a neural member.

In an embodiment, with reference to FIG. 1, neural member 100 includes axonal superconducting electrode 114; dendritical superconducting electrode 110 disposed opposing axonal superconducting electrode 114; synaptic barrier 112 interposed between axonal superconducting electrode 114 and dendritical superconducting electrode 112 and including a plurality of magnetic clusters 118 that have magnetic spin 118. Synaptic barrier 112 is a tunable magnetic barrier and is tunable between an ordered magnetic state M2 and disordered magnetic state M1 such that axonal superconducting electrode 114, dendritical superconducting electrode 110, and synaptic barrier 112 are arranged as a dynamically reconfigurable Josephson junction. Here, as in panel A of FIG. 3, synaptic barrier 112 is in disordered magnetic state M1, wherein magnetic spins 118 of magnetic clusters 116 point in a plurality of directions. Panel B of FIG. 3 shows synaptic barrier 112 in ordered magnetic state M2, wherein magnetic spins 118 of magnetic clusters 116 point substantially in a single direction. With regard to panel B of FIG. 3, it should be appreciated that the direction in which substantially all magnetic spins 118 of magnetic clusters 116 point in ordered magnetic state M2 can be selected to be along the z-axis or at any angle thereto, e.g., orthogonal to z-axis and directed along x-axis.

Figure 2:
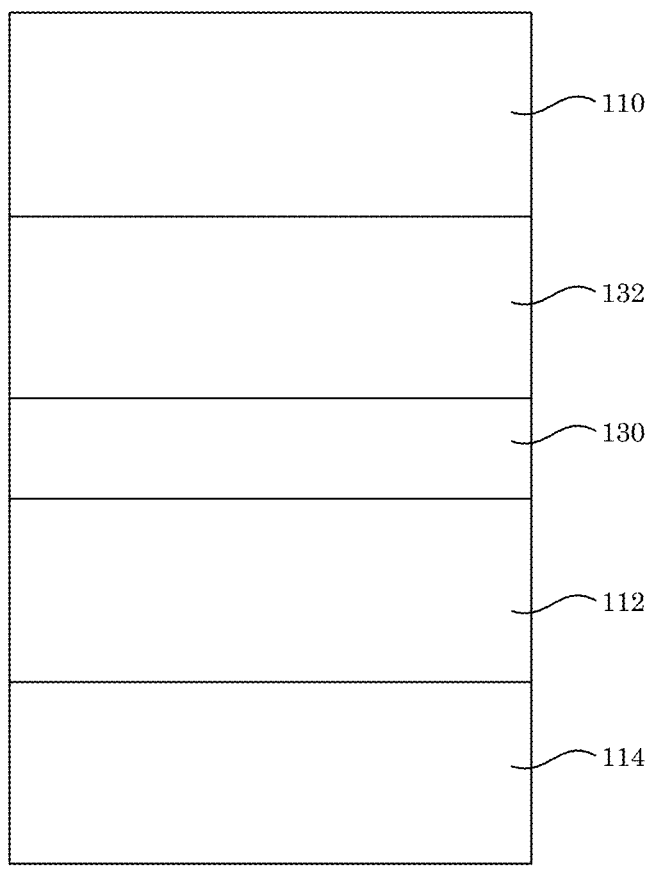
FIG. 2 shows a neural member.

In an embodiment, with reference to FIG. 2, neural member 100 includes ferromagnetic layer 132 interposed between dendritical superconducting electrode 110 and synaptic barrier 112. Neural member 100 can include spacing layer 130 interposed between ferromagnetic layer 132 and synaptic barrier 112.

According to an embodiment, with reference to FIG. 3, neural member 100 includes electric pulser 122 in electrical communication with dendritical superconducting electrode 110. Electric pulser 122 produces electric state pulse 120 and communicates electric state pulse 120 to dendritical superconducting electrode 110. Dendritical superconducting electrode 110 receives electric staple pulse 120 and communicates electric state pulse 120 through synaptic barrier 112 such that magnetic clusters 116 or in a presence of electric state pulse 120. Additionally, neural element 100 can include magnet 190 that can provide magnetic field of 192 between poles of magnet 190 as shown in panel B of FIG. 3. In this manner, synaptic barrier 112 can switch between ordered magnetic state M2 and disordered magnetic state M1 in response to electrical state pulse 120 subjected to the synaptic barrier. Further, neural member 100 can include electric pulser 124 in electrical communication with axonal superconducting electrode 114. Electric pulser 124 receives action state pulse 140 from axonal superconducting electrode 114. Action state pulse 140 provides a determination of whether synaptic barrier 114 is in disordered magnetic state M1 or ordered magnetic state M2. It is contemplated that a position of magnet 190 and direction of magnetic thought 192 can be different than that shown in FIG. 3 to provide for a selected direction in which magnetic spins 118 can point in ordered magnetic state M2. Accordingly, synaptic barrier 112 can switch between ordered magnetic state M2 and disordered magnetic state M1 in response to electrical state pulse 120 subjected to synaptic barrier 112. Also, synaptic barrier 112 can switch between ordered magnetic state M2 and disordered magnetic state M1 in response to electrical state pulse 120 in presence of applied magnetic field 192.

Figure 4:
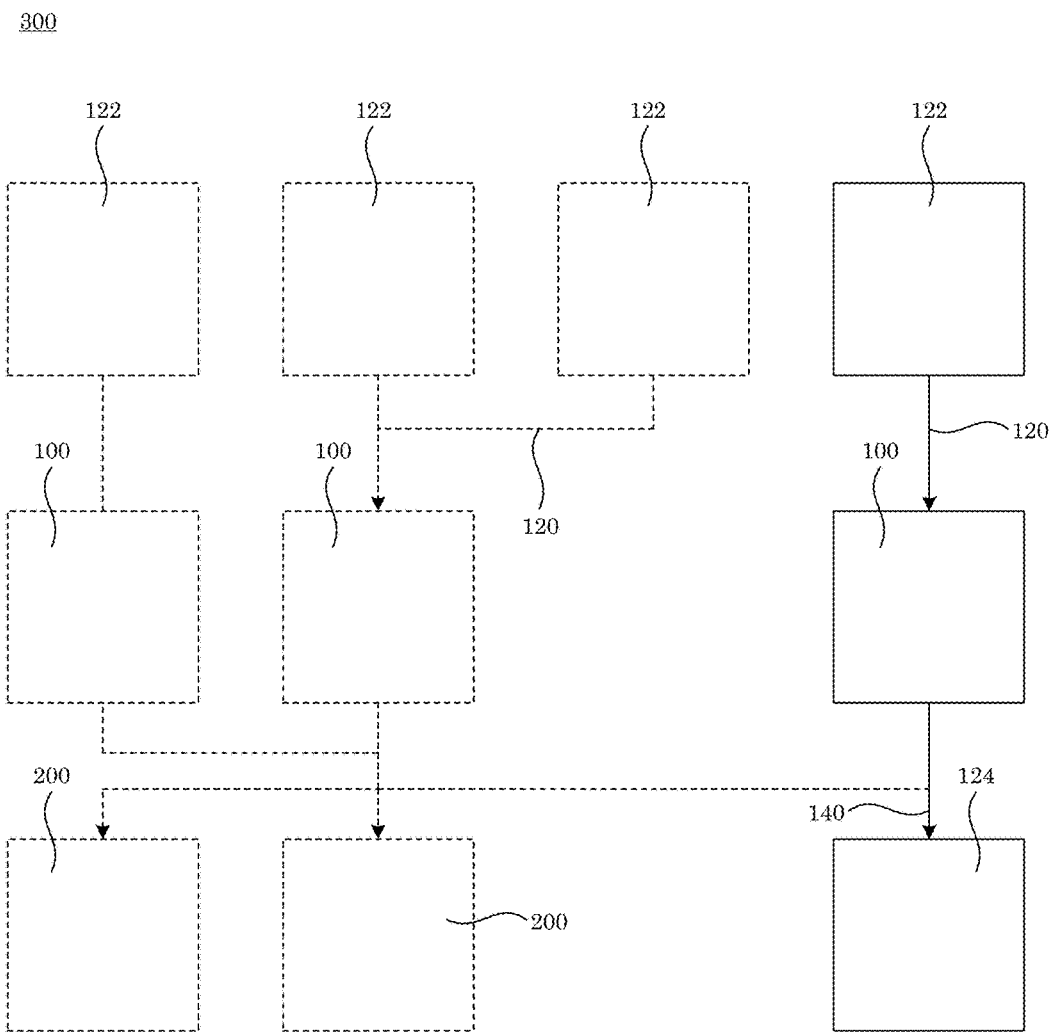
FIG. 4 shows a neural network.

In an embodiment, with reference to FIG. 4, neural network 300 includes electric pulser 122 in electrical communication with neural member 100. Neural member 100 can be in electrical communication with electrical pulser 124, neural member 200, or a combination thereof. A number of electrical pulsers 122, neural members 100, neural members 200, or electric pulser 124 can be selected and scaled as desired.

Figure 5:
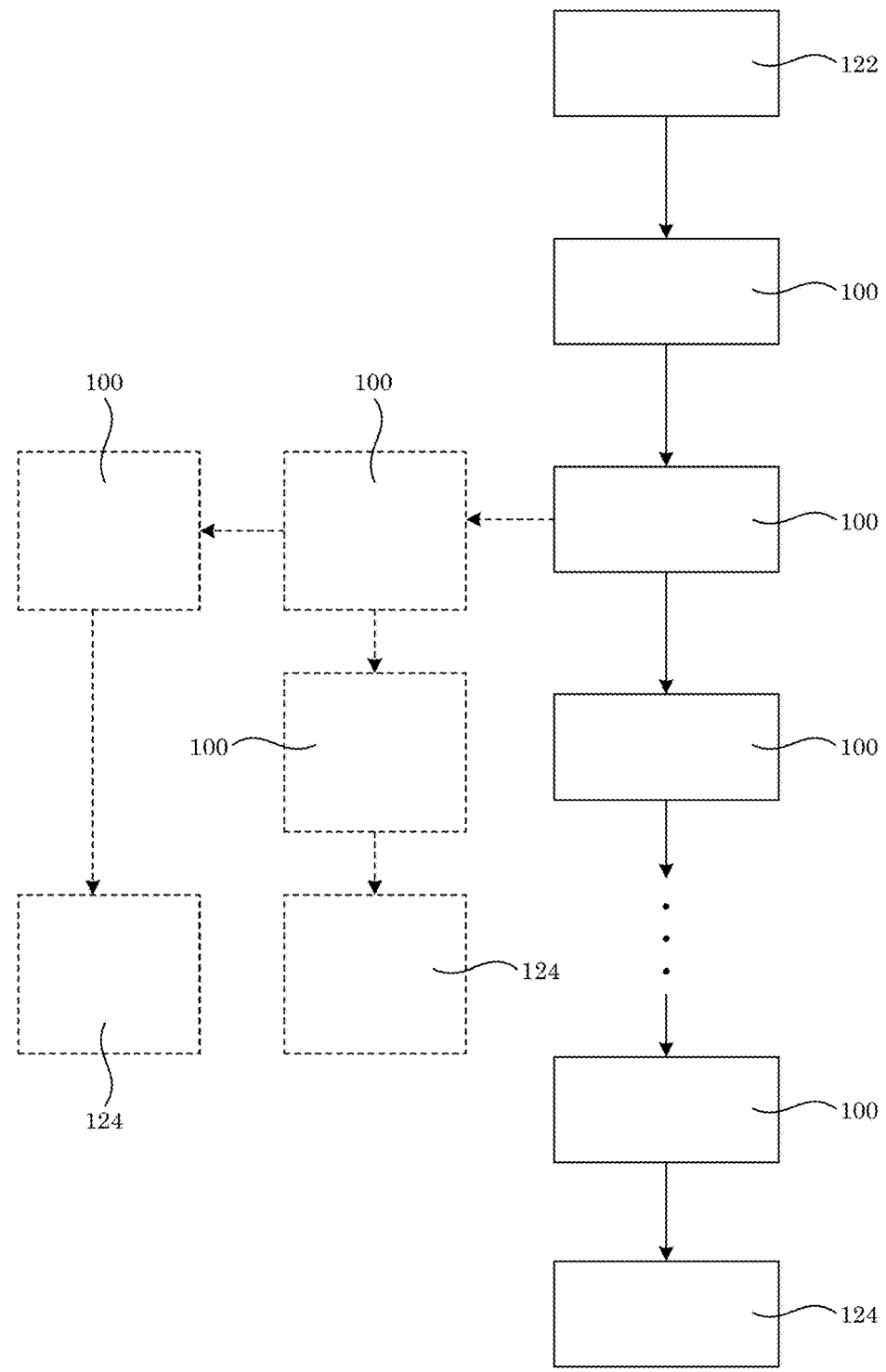
FIG. 5 shows a neural network.

According to an embodiment, with reference to FIG. 5, neural network 300 includes electric pulser 122 in electrical communication with neural member 100. Neural member 100 can be in electrical communication with electrical pulser 124, neural member 200, or a combination thereof. A number of electrical pulsers 122, neural members 100, neural members 200, or electric pulser 124 can be selected and scaled as desired.

Figure 6:
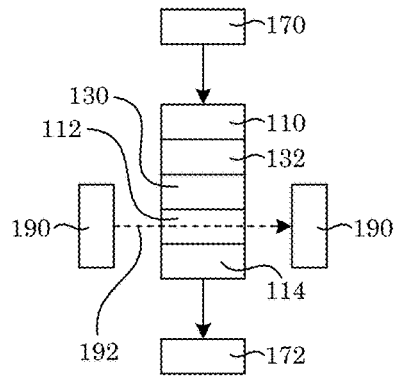
FIG. 6 shows a neurological memory.
Figure 6:
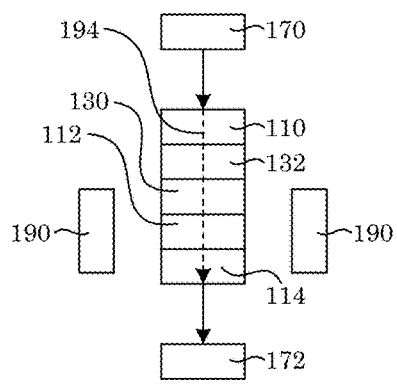
Figure 6:
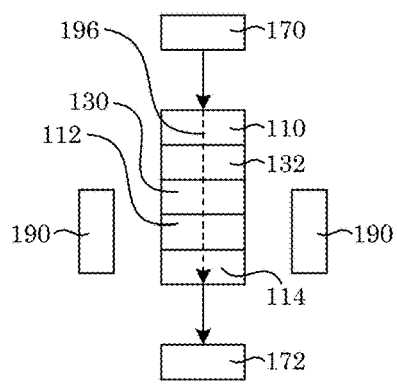

In an embodiment, with reference to FIG. 6, neurological memory 400 includes current source 170 in electrical communication with dendritical superconducting electrode 110 and that provides a current pulse (e.g., electric state pulse) to synaptic barrier 112. Voltage meter 172 is in electrical communication with axonal superconducting electrode 114 as a current sink for writing a bit (e.g., a 0 bit in panel A or a 1 bit panel B) and as a current pulse detector for reading the bit (0 or 1) stored in synaptic barrier 112. Here, the 0 bit can be stored, also referred to herein as writing, as disordered magnetic state M1 in synaptic barrier 112, and the 1 bit can be stored ordered magnetic state M2 in synaptic barrier 112. To write the 1 bit in synaptic barrier 112, synaptic barrier 112 is subjected to magnetic field 192. To write the 0 bit in synaptic barrier 112, synaptic barrier 112 is subjected current pulse 194 from current source 170, and the current is sunk to voltage meter 172. To read the bit stored in synaptic barrier 112, current pulse 196 is subjected to synaptic barrier 112 from current source 170 and detected by voltage meter 172. Here, current pulse 194 that writes the 0 bit is greater than current pulse 196 that reads the bit stored in synaptic barrier 112 as magnetic state M1 or M2.

In neural member 100, dendritical superconducting electrode 110 includes a material for provision of superconductivity and electrical conductivity at low temperature such as 4K. Exemplary materials for dendritical superconducting electrode 110 include NbN, Al, and the like. In an embodiment, dendritical superconducting electrode 110 includes Nb.

Axonal superconducting electrode 114 includes a material for provision of superconductivity and electrical conductivity at low temperature such as 4K. Exemplary materials for axonal superconducting electrode 114 include NbN, Al, and the like. In an embodiment, axonal superconducting electrode 114 includes Nb.

Synaptic barrier 112 is interposed between dendritical superconducting electrode 110 and axonal superconducting electrode 114. Synaptic barrier 112 provides a medium in which to disposed magnetic clusters 116. Exemplary materials for synaptic barrier 112 include Si, Cu, and the like. In an embodiment, synaptic barrier 112 includes Si.

Magnetic clusters 116 have magnetic spin 118 and provide disordered magnetic state M1 or ordered magnetic state M2 to synaptic barrier 112. Moreover, neural member 100 is selectively switchable between disordered magnetic state M1 and ordered magnetic state M2 due to orientation of magnetic spins 118 by magnetic field 192, electric state pulse 120, current pulse 194, and current pulse 196. Exemplary materials for magnetic clusters 116 include Fe, Ni, and the like, or a combination thereof. In an embodiment, magnetic clusters 116 includes Mn.

Neural member 100 can include spacing layer 130 that includes, e.g., include Cu, Nb, and the like. In an embodiment, spacing layer 130 includes Cu. Spacing layer 130 provides decoupling of the magnetic clusters in the synaptic barrier 112 from the spin polarizing layer 132.

Neural member 100 can include a ferromagnetic layer 132 that includes, e.g., include Fe, NiFe, and the like. In an embodiment, ferromagnetic layer 132 includes Ni. Ferromagnetic layer 132 provides a material to spin polarize the electrons impinging on the synaptic barrier 112.

It is contemplated that neural network 300 can include neural member 100 in combination with neural member 200 as shown in FIG. 4, wherein the neural member 200 has a larger critical current then neural member 100. Neural member 100 can have a Josephson critical current from less than 1 µA to more than 100 µA, specifically from 10 µA to 1 mA. Moreover, neural member 200 can have a critical current from less than 1 µA to more than 10 µA, specifically from 100 nA to 1 µA.

Magnet 190 provides magnetic field 192 to which synaptic barrier 114 is subjected and which orients magnetic spins 118 of magnetic clusters 116. Magnet 190 can be an external magnet to the devices, or a magnetic field produced by a current traveling through a superconducting wire that passes near the device. In an embodiment, magnet 190 is a superconducting wire that is fabricated on top of the device separated by an insulating layer. The strength of magnetic field 192 can be, e.g., from 1 oersted (Oe) to 1000 Oe, specifically from 10 Oe to 50 Oe.

Electric pulsers (122, 124) provide pulses of electrical current. Exemplary electric pulsers (122, 124) include Josephson junctions such as, magnetic Josephson junctions such as neural member 100, and the like, or a combination thereof. In an embodiment, electric pulsers (122, 124) independently includes Nb/aluminum oxide/Nb Josephson junctions.

Current source 170 provides current pulses. Exemplary current sources 170 include an array of Josephson junctions, a switched capacitor, and the like, or a combination thereof. In an embodiment, current source 170 includes an external CMOS current pulse.

Sense amp 172 reads the state of the magnetic clusters in barrier layer 112 by probing the Josephson critical current of memory element 400. Exemplary sense amp is 172 include a Josephson comparator and the like. In an embodiment, sense amp 172 includes Nb based a Josephson comparator.

In an embodiment, a process for making neural member 100 includes sputter depositing the axonal electrode of Nb followed by the deposition of Si and Mn either co-sputtered or layered followed by the deposition of the dendritical electrode. The film stack can then be annealed at high temperature to precipitate the clusters after which the device can be lithographically defined.

Spacing layer 130 can be included in neural member 100 by sputter deposition subsequent to the barrier layer.

Ferromagnetic layer 132 can be included in neural member 100 by sputter deposition subsequent to the spacer layer.

Magnet 190 can be arranged relative to synaptic barrier 114 as a wire spaced near the barrier either laterally for vertically integrated.

Electric pulsers (122, 124) can be connected to superconducting electrodes (110, 112) by superconducting wiring.

A plurality of neural members 100 can be interconnected by superconducting wiring.

Current source 170 and voltage meter 172 can be connected to superconducting electrodes (110, 112) by via superconducting wiring.

Figure 7:
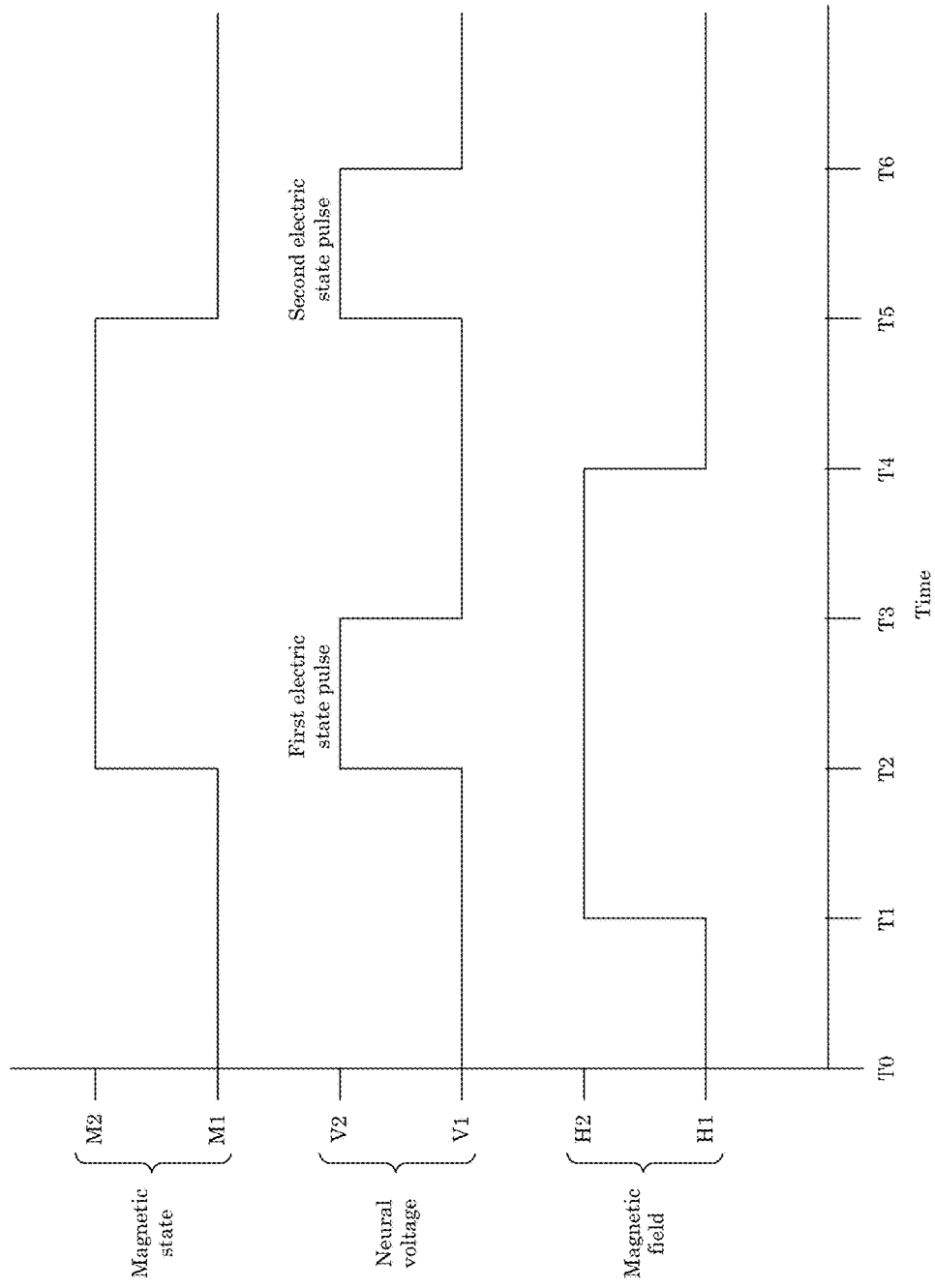
FIG. 7 shows graphs of magnetic order, neural voltage, and magnetic field versus time.

According to an embodiment, with reference to FIG. 7, a process for training neural member 100 includes: subjecting synaptic barrier 112 of neural member 100 to magnetic field 192 with synaptic member 112 in disordered magnetic state M1; subjecting synaptic barrier 112 to first electrical state pulse 120A; changing from disordered magnetic state M1 to ordered magnetic state M2 in synaptic barrier 112 in response to first electrical state pulse 120A in presence of magnetic field 192; maintaining ordered magnetic state M2 in synaptic barrier 112 in an absence of electrical state pulse 120A; subjecting synaptic barrier 112 to second electrical pulse 120B in an absence of magnetic field 192; and changing from ordered magnetic state M2 to disordered magnetic state M1 in synaptic barrier 112 in response to second electrical state pulse 120B in the absence of magnetic field 192 to train neural member 100.

Subjecting synaptic barrier 112 of neural member 100 to magnetic field 192 with synaptic member 112 in disordered magnetic state M1 includes applying a current in the magnetic field producing line 190 that is small enough in magnitude to not reorient the clusters on its own.

Subjecting synaptic barrier 112 to first electrical state pulse 120A includes sending a short electrical pulse through neural member 100.

Changing from disordered magnetic state M1 to ordered magnetic state M2 in synaptic barrier 112 in response to first electrical state pulse 120A in presence of magnetic field 192 includes applying both the magnetic field and electrical pulse.

Maintaining ordered magnetic state M2 in synaptic barrier 112 in an absence of electrical state pulse 120A is nonvolatile and will be maintained for a period of time that can be calculated from the energy barrier of the magnetic clusters and can be a long duration of time for example 10 years.

Subjecting synaptic barrier 112 to second electrical pulse 120B in an absence of magnetic field 192 will disorder the magnetic clusters.

Changing from ordered magnetic state M2 to disordered magnetic state M1 in synaptic barrier 112 in response to second electrical state pulse 120B in the absence of magnetic field 192 to train neural member 100 includes the application of an electrical pulse in the absence of a magnetic field.

Figure 8:
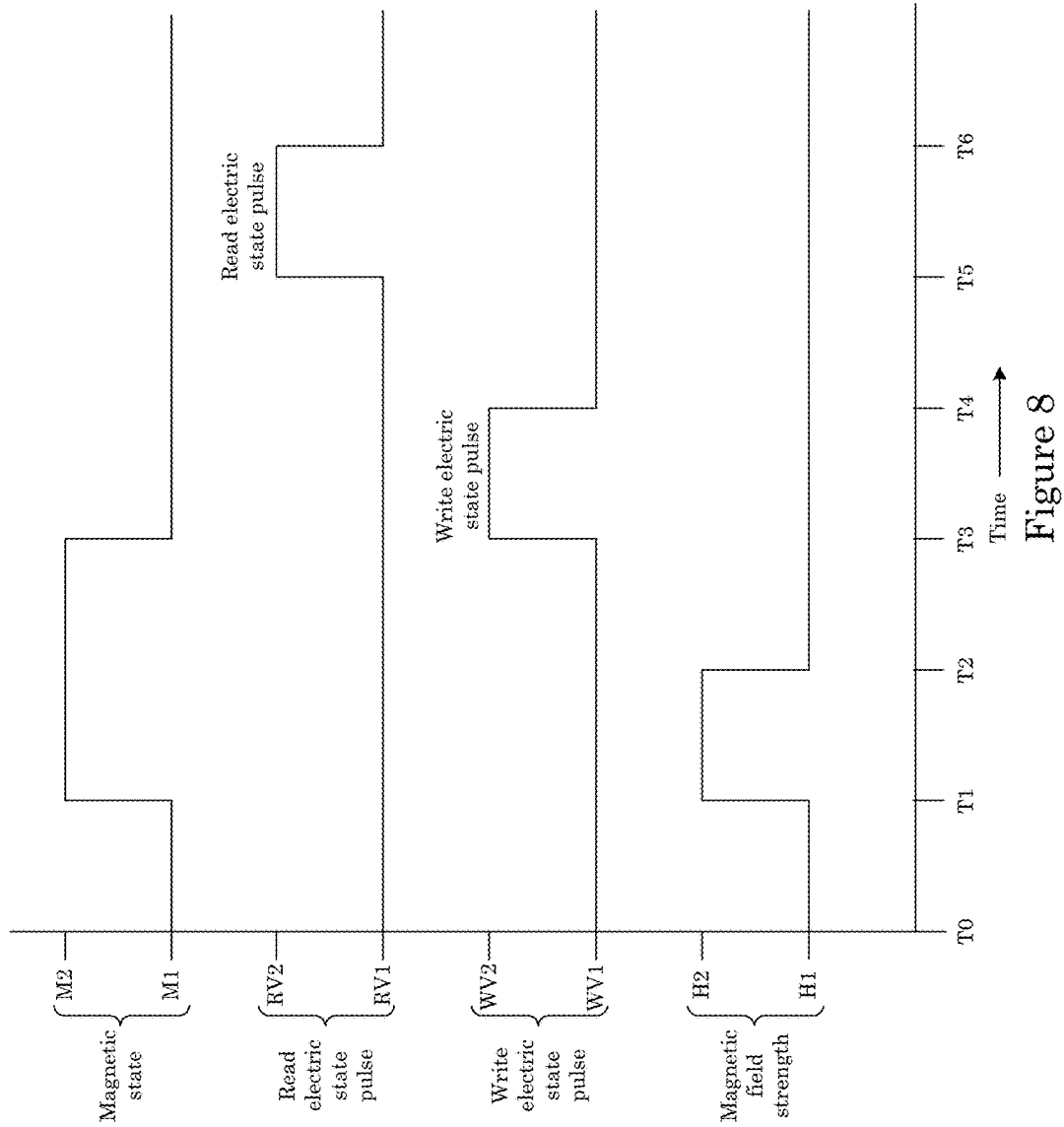
FIG. 8 shows graphs of magnetic state, read electric state pulse, right electric state pulse, and magnetic field strength versus time.

After training neural member 100, neural member 100 can be used to read or write bits to synaptic barrier 112 as shown in FIG. 8. Here, magnetic field 192 is subjected to synaptic barrier 112 during time T1 to time T2, and right electric state pulse is subjected to synaptic barrier 112 during time T3 to time T4. Thereafter, the debt stored in synaptic barrier 112 is read by subjecting synaptic barrier 112 by a read electric state pulse during time T5 to time T6.

Neural member 100 and processes herein have numerous advantageous and unexpected properties. Unexpectedly, artificial synapse 100 provides a very low training energy of less than 10 aJ. In addition, there is a large dynamic range of the Josephson critical current of current of 2 orders of magnitude. The large dynamic range indicates that the Josephson junction is extremely sensitive the order of the magnetic clusters in the barrier layer.

The articles and processes herein are illustrated further by the following Examples, which is non-limiting.

EXAMPLES

Example 1. Ultra-Low Power Artificial Synapses Using Nano-Textured Magnetic Josephson Junctions A neural member described in this Example provides for performance of neuromorphic computing for improving efficiency of computational tasks such as perception and decision making. Here, we demonstrate the neural member as an artificial synapse with a dynamically reconfigurable superconducting Josephson junction that includes magnetic nanoclusters in a synaptic barrier. Spiking energy per pulse varies with the magnetic configuration, but the spiking energy can be less than 1 attojoule (aJ). For reference, spiking energy per synaptic event in the human brain is about 10 fJ. The artificial synapse includes a Si synaptic barrier that includes Mn nanoclusters and superconducting Nb electrodes. A critical current of the synapse junction, analogous to the synaptic weight, can be tuned using input voltage spikes that change the spin alignment of Mn nanoclusters. The synaptic weight training is performed with electrical pulses as small as 3 aJ. Further, the Josephson plasma frequency of the neural member, which determines the dynamical time, exceeds 100 GHz. These artificial synapses provide a neuromorphic platform that is faster, more energy efficient, and attain greater complexity than conventional technologies.

The artificial synapses are compatible with single flux quantum (SFQ) Josephson Junction (JJ) circuits that provide a platform for a large neuromorphic system. Based on the Josephson effect, a JJ can produce fast, low-voltage spikes of a few picoseconds in duration when the current through the junction exceeds its critical current $I_C$. These single flux quantum (SFQ) spikes have a time-integrated voltage amplitude given by the flux quantum $\Phi_0 = 2.068 \times 10^{-15}$ Vs. With its intrinsic spiking behavior, neuromorphic SFQ circuitry has been demonstrated. A missing component of these neuromorphic systems has been a compact low-energy plastic synapse analogue. The neural member is a synaptic element based on a dynamically reconfigurable JJ synapse capable of non-Hebbian learning. Accordingly, the neural member has a power consumption and size-scaling for a low-power, complex neuromorphic system that can include SFQ neurons.

Figure 9:
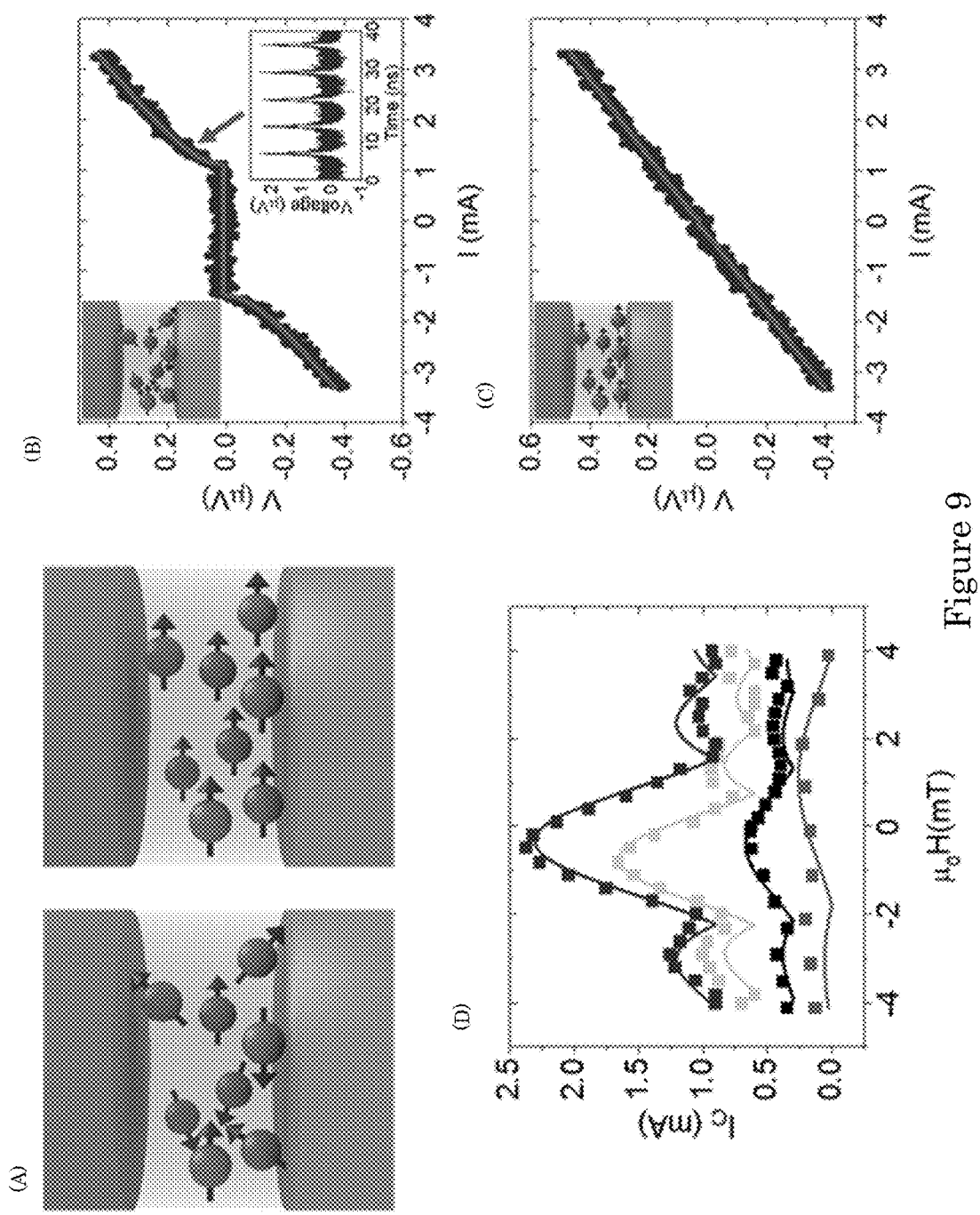
FIG. 9 shows a neural member in panel A, a graph of voltage versus current in panel B, a graph of voltage versus current in panel C, a graph of critical current versus magnetic field strength in panel D.

The neural member artificial synaptic element weights the input and output signals to and from neuronal elements. In the human brain, this is accomplished in part by long term changes in the quantity of neurotransmitter vesicles and the number of neurotransmitter receptors. For example, a synaptic connection would be strengthened if the number of receptors in the postsynaptic dendrite were increased. The artificial synapse demonstrated below is composed of a JJ barrier that contains Mn nanoclusters and superconducting Nb electrodes. Each of these clusters has a net spin alignment. By aligning the net spins of several clusters, we increase the overall magnetic order in the JJ synapse, which tunes the critical current of that synapse. By changing the critical current of the JJ synapse, we can change the connection strength between two neuronal SFQ elements. FIG. 9a shows a schematic of a JJ synapse in the strong and weak weighting configurations. The amount of magnetic order between the clusters is analogous to the number of neurotransmitter receptors in the biological system.

The superconducting critical current is characterized as a function of the magnetic nanocluster configurations. Such device transport measurements for a 10 µm circular JJ synapse is shown in FIG. 9b and FIG. 9c. The device voltage vs. current for a JJ synapse that is in the disordered magnetic state is shown in FIG. 9b. The relatively large value of the superconducting critical current corresponds to a strong synaptic weighting value. The data (blue circles) are well fit by a standard resistively shunted junction model (25) with a critical current of 1.30 mA±0.02 mA and a normal state resistance of 1.32 mΩ±0.02 mΩ. The DC voltage that is measured here is actually the time average of the spiking state of the JJ synapse. When the superconducting critical current is exceeded, the device leaves the superconducting state and enters the voltage state, where it starts emitting SFQ pulses. The bottom inset in FIG. 9b shows a device simulation displaying the spiking behavior, which upon time averaging gives the measured average voltage-current characteristic.

The magnetic ordering of the nanoclusters of a JJ synapse can be increased by applying current pulses in an applied magnetic field, which will lower the synaptic weighting value of the devices. To increase the synaptic weight, one must decrease the magnetic order in the barrier, which can be accomplished by applying electrical pulses in zero field. The high synaptic weight state (low magnetic order) of a 10 µm circular JJ synapse is shown in FIG. 9b. The application of a 5 mT static field alone does not change the magnetic order in the artificial synapse. However, the combination of electrical pulses in an external 5 mT magnetic field sets the device into the low synaptic-weight state, i.e. magnetically ordered (FIG. 9c). Here, the ordering was done with 11 electrical pulses of about 4 pJ and 1 ns in duration. In the magnetically ordered state, there is a substantial decrease in the superconducting critical current, $I_c$=0.08 mA±0.02 mA while maintaining approximately the same normal state resistance of 1.30 mΩ±0.02 mΩ.

To scale the devices to a size below 100 nm the observed change in $I_c$, and thus the synaptic weight, would ideally be the result of the interaction between the superconducting and magnetic order parameters, as opposed to the result of stray field from the barrier on the superconducting electrodes. This is the dominant mechanism for the change in $I_c$ in the JJ synapses. A JJ with a uniform barrier leads to a Fraunhofer diffraction pattern of the superconducting order parameter (as measured by the JJ critical current $I_c$) as a function of applied magnetic field. For circular JJ synapses in the disordered and partially ordered states, the critical current vs. applied field data can be fit to an Airy function. FIG. 9d shows the $I_c$ vs. applied field data from a 10 µm diameter JJ synapse for 4 different levels of magnetic order. The data are presented in a waterfall plot with each magnetically less ordered dataset being offset by positive 0.3 mA relative to the previous dataset. The solid lines through the data points in FIG. 9d are fits to the Airy function as expected for circular junctions. In the most disordered state (blue) there is a shift of the central peak of −0.36 mT±0.04 mT. This implies that there remains some overall magnetic order even in this "disordered" state. The magenta, black, and red data show further ordering of the same device. The side lobes do not fit the Airy function well, indicating that the current flow through the junction is non-uniform for those applied fields. This is likely the result of local magnetic order in the magnetic nano-clusters. The reduction in amplitude of the main peak of the Fraunhofer patterns indicates that the dependence of $I_c$ on magnetic order is due to the interaction between the superconducting order parameter and the net spin ordering of the nanoclusters in the JJ synapse. Therefore, the devices should not lose their wide synaptic weight range when scaled to much smaller sizes.

Figure 10:
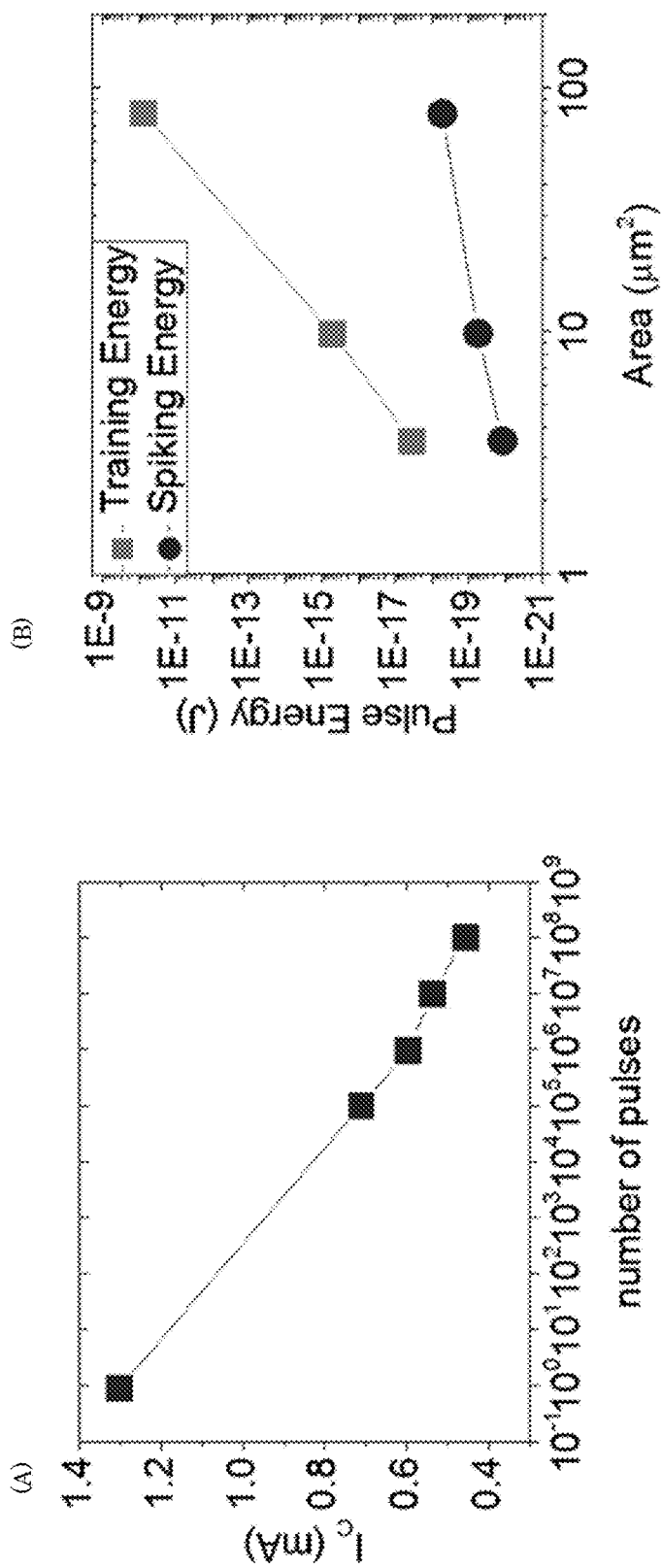
FIG. 10 shows a graph of critical current versus number of pauses in panel a and a graph of pulse energy versus area in panel B.

With regard to device operation and scaling, a scheme to change the synaptic weighting via changing magnetic order using electrical current pulses is shown in FIG. 10a for a 10 µm diameter JJ synapse. Starting in a disordered state with high synaptic weight, the net Mn nanocluster spins are increasingly ordered using 70 ps rise time, 242 ps, 11 pJ, current pulses that are applied in a 20 mT magnetic field. The value of $I_c$ is reduced in a relatively continuous manner, as is desired for variable weight tuning of a synapse. We expect that given enough pulses, the trend in FIG. 10a will eventually saturate to the minimum value of about 10 µA. The slow variation in $I_c$ with a larger number of pulses will be useful in architectures where the synapse is undergoing online learning, where small changes of synaptic weight are desired for any given pulse. In the case of an architecture with an initial training phase, after which the operating pulses are not desired to alter the synaptic weight, a larger pulse energy could be used to dramatically speed up the process. The energy required to change the magnetic order of the devices is more efficient than a simple Joule heating mechanism. In the case of FIG. 10a, if all the energy in these current pulses went into heating the junction we would expect roughly a 15 K temperature increase, which is below the 52K magnetic blocking temperature of this device. This implies a direct interaction between the spin clusters and the current, an effect that becomes more pronounced for the smaller device sizes shown below.

Reducing the size of the JJ synapse should also reduce the total energy per pulse that is required to change the magnetic order. This general size-energy scaling behavior for single pulse ordering can be seen in FIG. 10b. In the smallest JJ synapses, with an elliptical cross section of 1.5 μm×3.0 μm, the energy required for ordering the magnetic clusters is 3 aJ, excluding the energy required to supply the 20 mT external field. It should be noted that these synapses operate at 4 K and thus a neuromorphic system based on this technology has an additional cooling overhead. Typically for larger scale systems, one can cool 1 W at 4 K using 1 kW of power. Even considering this overhead for cooling, large scale systems of JJ synapses with $10^{18}$ synaptic events per second will be more energy efficient than either CMOS or biological systems with a clear path to further lowering the energy by reducing the JJ synapse size. It should also be noted that 3 aJ is the energy required to tune the JJ synapse. The energy per synaptic spike (the mechanism of information transfer during real-time operation of a neural system) is given by the SFQ pulse energy $I_c\Phi_0/2\pi$. This energy is lower than that of the magnetic cluster ordering for these JJ synapses. FIG. 10b shows the size energy scaling for both JJ synapse tuning (red squares), and for synaptic spiking (blue circles). The data in blue are the calculated SFQ pulse energies at the maximum $I_c$ of the JJ synapses, at lower $I_c$ values (in the magnetically ordered state) the SFQ pulse energy is reduced further, with a minimum SFQ pulse energy for the 1.5 μm×3.0 μm JJ synapse being 2.6 zJ±2 zJ. The energy for ordering the magnetic clusters and the operating pulse energy are reduced as the device size in decreased. The training energy reduces rapidly with device diameter perhaps due to non-uniform current density during the application of the training pulses in the larger devices.

Magnetic JJs with the reduction in Mn cluster size and barrier thickness can attain similarly small sizes. It may reduce the complexity of design for neuromorphic JJ synapse systems if no magnetic field control lines were included to order the JJ synapses. The orientation of the ferromagnet in a magnetic JJ, for use in cryogenic memories, can be manipulated using spin transfer torques, which allows the devices to attain the ordered (parallel) state and the disordered (antiparallel) state without the use of external fields. Incorporating similar polarizing structures in the JJ synapse may eliminate magnetic field control lines while maintaining the full dynamic range of the JJ synapse.

We have developed circuit models of the JJ synapses in software (commercially available under the name Verilog) and ported them in simulation software (commercially available under the name SPICE) for SFQ circuit modeling. A modified version of the resistively and capacitively shunted junction (RCSJ) model was used to simulate the reconfigurable JJ synapses. The dynamical equations of a JJ, in the simplest model, are isomorphic to that of a forced damped pendulum. An SFQ pulse, our synthetic neural spike, corresponds to one revolution of the pendulum overcoming a potential energy barrier of $I_c\Phi_0/2\pi$. The spiking rate is dependent on the energy barrier, the input current, and the device temperature. One can calculate the Josephson plasma frequency in this model as $\omega_p=\sqrt{2\pi I_c/\Phi_0 C}$, where C is the capacitance of the junction. Using the values for the 1.5 μm×3.0 μm junctions demonstrated above, we estimate that the natural frequency of these junctions would be 170 GHz. This natural frequency would allow for very high-speed implementations of neuromorphic systems based on the JJ synapse.

The dynamical equations of a JJ synapse are similar to those for a standard JJ except that the JJ synapse device parameters, such as critical current, are dependent on the internal magnetic structure characterized with a magnetic order parameter:

$$m = \frac{1}{M}\sum_i \vec{m}_i,$$

where $\vec{m}_i$ are the moments of each Mn cluster and M is the total moment of all clusters. The effect of the magnetic order parameter m should be governed by the superconducting proximity effect in ferromagnetic metals. The ordering of the magnetic clusters may be analogous to changing the thickness of the ferromagnetic layer. Thus, the variation of $I_c$ could be quite complex and non-monotonic. With materials tuning, we can fabricate JJ synapses with electrical parameters such that $I_c$ will be reduced in an approximately linear manner with increasing magnetic order. This behavior is:

$$I_C(m, T) = ((1-m)I_{CV} + I_{CM})\left(1 - \left(\frac{T}{T_c}\right)^2\right), \quad (1)$$

where $I_{cv}$ is the portion of the critical current that changes with the magnetic state, $I_{cm}$ is the minimum critical current in the totally ordered magnetic state, T is the device temperature, and $T_c$ is the superconducting critical temperature. In the model used for this work, $I_{cv}$=8 μA, and $I_{cm}$=2 μA corresponding to a 10 μA maximum critical current achieved when m=0 (disordered state) and T=0. The magnetic order parameter varies with the integrated junction voltage as dm∝V(t)dt between m=0 and m=1; in other words, a voltage pulse across the junction causes the order parameter to increase and critical current to decrease, up to a saturation point.

Figure 11:
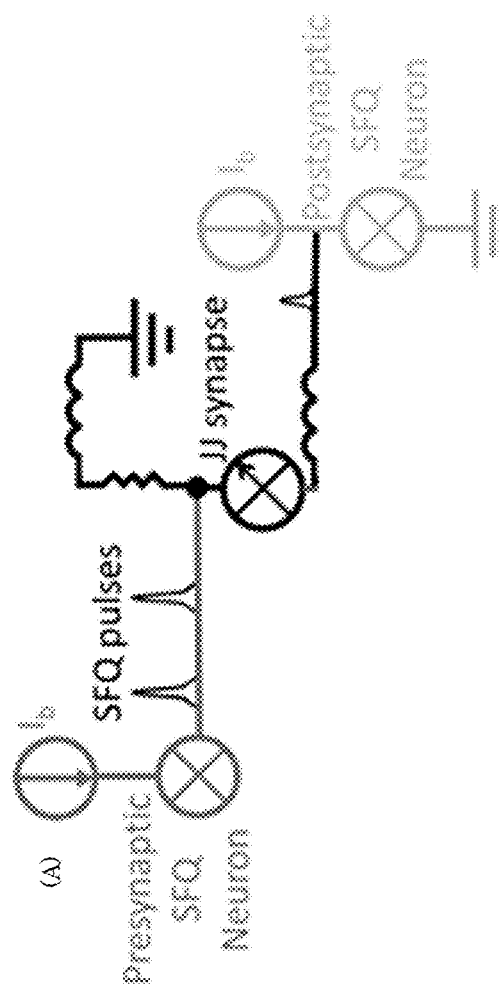
FIG. 11 shows a circuit diagram for neural member in panel A, a graph of output voltage versus time in panel B, and a graph of output voltage versus time in panel C.
Figure 11:
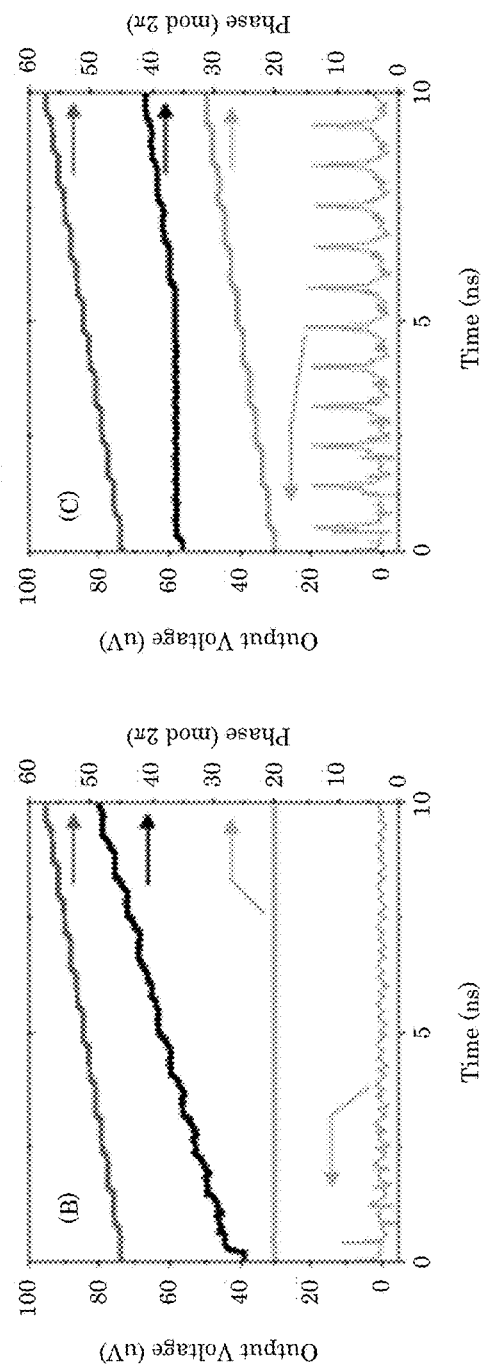

The circuit schematic that was used to test the basic neuromorphic circuit element that demonstrates the function of the JJ synapse is shown in FIG. 11a. The circuit demonstrates the basic functionality of the nano-textured magnetic JJ as a synapse. A standard single SFQ JJ is used to represent a pre-synaptic neuron that is firing, shown in blue. This JJ provides the input pulses for the circuit. The JJ synapse element acts to weight the pulses from the pre-synaptic neuron is shown in black. This synapse will pass more of the input pulse when it remains in the superconducting state and less when it enters the voltage state. The post-synaptic neuron is again modeled as a single standard SFQ JJ, shown in red. The post synaptic neuron is biased below the firing threshold and so it does not fire unless a sufficiently large spike is passed by the JJ synapse. This JJ acts as the output for the circuit element and in larger networks would be hooked up to subsequent layers via additional JJ synapses.

FIG. 11b shows the output of the three main elements for the case of a low synaptic weight, as implemented with low $I_c$ (10 μA). The phase of the presynaptic JJ neuron shows $2\pi$ phase jumps indicative of constant pulsing that is a result of the input current bias being set to the on state, shown in blue. The phase of the JJ synapse is also evolving because it is going into the voltage state with each input pulse. This acts to dissipate the energy of the input pulse and thereby it creates a weak connection between the presynaptic JJ neuron and the postsynaptic JJ neuron. The postsynaptic JJ neuron is not firing because of this weak connection. FIG. 11c shows the result when the synaptic weight is increased by increasing the critical current of the JJ synapse to 60 μA. In this case the input is the same, as seen by the $2\pi$ phase jumps of the presynaptic neuron. However, now the JJ synapse does not always enter the voltage state when the input is firing. With the larger the JJ synapse makes a stronger connection between the presynaptic JJ neuron and the post synaptic JJ neuron. With high synaptic weighting, the postsynaptic JJ neuron sends output spikes as seen both in $2\pi$ phase slips and voltage spikes in red. In addition, as can be seen for times later than 5 ns in FIG. 11c, even when the JJ synapse does enter the voltage state with high $I_c$, it does not shunt enough of the input pulse to stop the output JJ from firing, and thus it maintains its high synaptic weight function.

Figure 12:
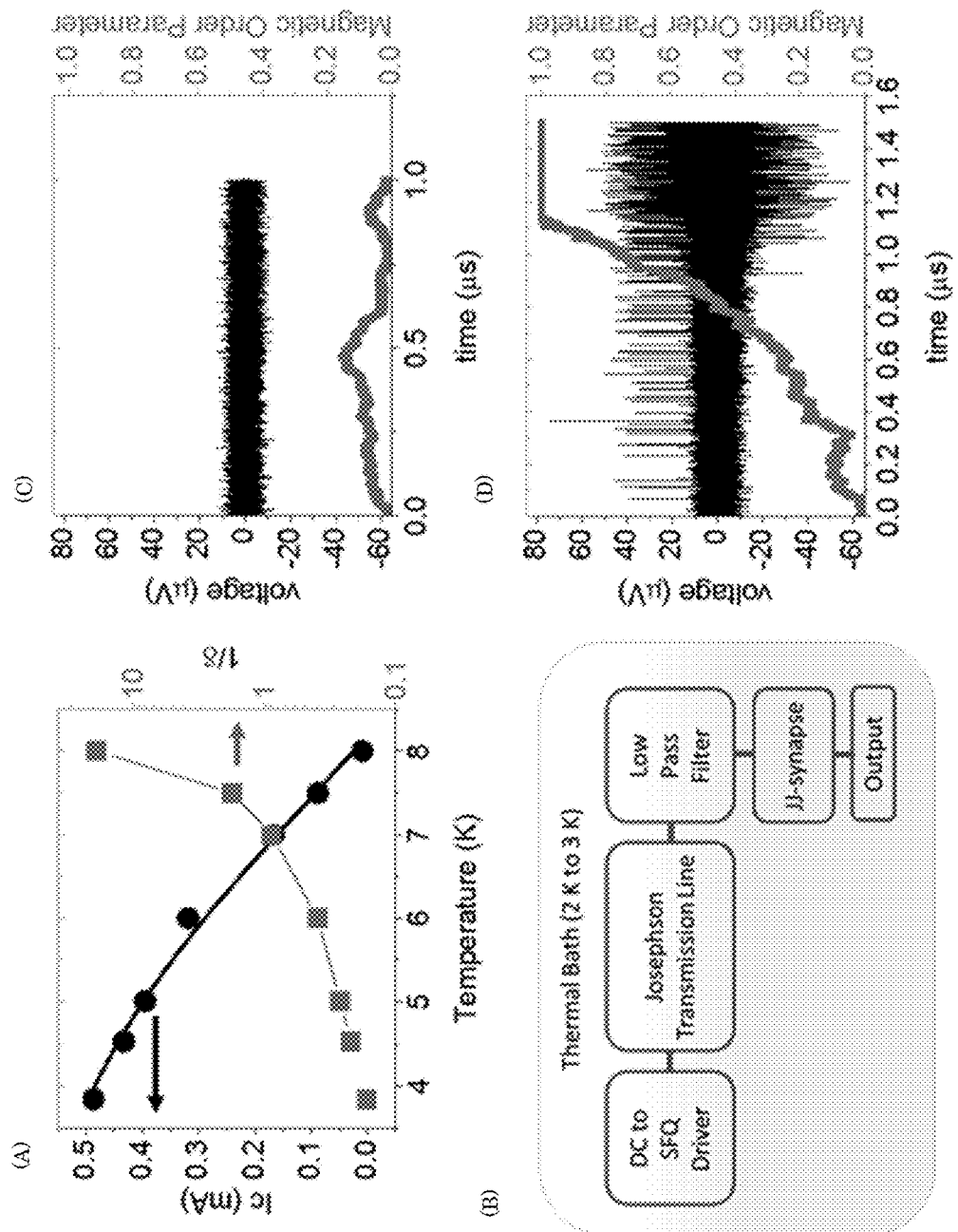
FIG. 12 shows a graph of critical current versus temperature in panel A, a circuit model in panel B, a graph of voltage versus time in panel C, and a graph of voltage versus time in panel D.

Stochasticity mimics natural brain operation and benefits learning algorithms in deep neural networks. Because we can operate near the thermal stability limit of the JJ synapse, we can induce variable amounts of stochasticity in our circuits by elevating the temperature. We define the stochasticity as $1/\delta$, where $$\delta = \frac{\phi_0 I_c}{2\pi k_B T}$$

is the thermal stability given by the ratio of the spiking energy barrier to the thermal energy. Here $k_B$ is the Boltzmann constant and T is the temperature in kelvins. For values of the stochasticity less than one, the dynamics are basically deterministic, whereas when the stochasticity is greater than one there is a significant stochastic component. Given the large nonlinear variation of $I_c$ with temperature near the superconducting critical temperature $T_c$, we can expect to be able to vary $1/\delta$ over a wide range by adjusting temperature over just a few degrees, thereby controlling the amount of stochasticity in the neural circuit. We find there is a smooth nonlinear variation of the $I_C$ as a function of temperature in the partially ordered state of a 10 μm JJ synapse, as shown in FIG. 12a. On the right axis of FIG. 12a we plot $1/\delta$ for a simulated device with a diameter of 100 nm to show the large range of potentially available stochasticity in smaller devices.

To investigate the potential advantages of stochastic neuromorphic SFQ circuits, we developed a SPICE model that includes thermal fluctuations. Specifically, an additional current branch is added to our modified RCSJ model to account for white noise current fluctuations. Theoretically the thermal fluctuations have constant power spectral density, given by the Johnson-Nyquist formula as $$S_I(f) = \frac{4k_B T}{R_N}.$$

As the thermal stability ratio $\delta$ becomes smaller, the probability for a Josephson Junction to be temporarily biased into the voltage state and emit an SFQ pulse becomes larger.

FIG. 12b shows a block diagram of the circuit that we modeled to understand the influence of thermal noise on JJ synapses. In these simulations, the magnetic order parameter varies from m=0 to m=1 within 100 SFQ voltage pulses, and we monitor the spiking rate output by a JJ synapse. Given a certain input current, a reconfigurable JJ synapse will generate SFQ voltage spikes at a rate that is nonlinearly dependent on $I_c$, which is dependent on the history of input spikes, the input current, and device temperature. The JJ synapse circuit, shown in FIG. 12b, was simulated at two different temperatures, with the same input spike stream to show the effects of stochasticity and the dynamically reconfigurable magnetic order. At 2 K there is no significant change in output spiking of the simulated circuit (FIG. 12c), and the simulated magnetic order parameter does not change significantly. By increasing the simulated temperature to 3K, and thus the stochastic energy in the JJ synapse, both the magnetic order parameter and the output voltage spiking changes significantly (FIG. 12d). In this case the magnetic order parameter increases as it accumulates incoming spikes, which leads to more spiking activity out of the JJ synapse for the same initial input spike train.

The neural member with dynamically tunable JJ has been demonstrated with application as a synthetic synaptic element for superconducting neuromorphic computing. In these devices, the JJ critical current, in zero applied magnetic field, can be varied in an analog manner. The device behaves naturally as an artificial synapse that can interact with low energy electrical pulses. There are potentially other applications of these novel JJs. For example, the low energy involved in changing the order of the magnetic clusters makes this barrier an excellent candidate for cryogenic memory applications. Possibly as the magnetic free layer material in a pseudo-spin-valve magnetic JJ. In addition, because of their natural spiking behavior, these devices could be used as integrate and fire neurons.

The neural member has an external magnetic field to order the magnetic nano-clusters in the JJ synapse. One physical implementation would be to lithographically pattern magnetic field control lines above the JJ synapses. This type of implementation should work up to considerable scale, as evidenced by field switched magnetic random access memory products that are currently available with more than $1.6 \times 10^7$ bits per chip. However, implementations without additional field control lines would allow even better scaling. Spin polarizing layers should also allow for the elimination of a field control line in future JJ synapses. If in addition, the energy for reordering of the magnetic clusters is on the order of the SFQ pulse energy, the JJ synapses will be capable of Hebbian learning. The scaling of pulse energy with device size appears to be a promising path towards realizing magnetic cluster reordering energy that will be on the order of the SFQ pulse energy.

An advantage of this system is its ability to leverage existing digital SFQ JJ logic infrastructure. In addition, because of their superconducting nature, SFQ circuits can have so called ballistic communications, both on-chip and chip-to-chip, with data transmission rates demonstrated up to 100 Gbps. The main advantage is that the transmission of SFQ pulses is not limited by the typical capacitive charging, which semiconductor electronics typically face. The high-speed communications could be combined with one of the many neuromorphic interconnect strategies that have been developed in CMOS, such as matrix-vector multipliers combined with thresholding, tree routing, or self-timing. Leveraging of fabrication tools and techniques that have been developed for CMOS and modified for both commercial MRAM and large scale digital SFQ logic should greatly accelerated the progress of neuromorphic circuits using JJ neurons and JJ synapses.

The devices were measured in a liquid He flow cryogenic probe station with a base temperature of 3.9 K and a stability of ±5 mK. The chips were thermally heat sinked to the cold stage with an $In_{0.51}Bi_{0.325}Sb_{0.165}$ alloy. High-speed pulses were provided via microwave cables and ground-signal-ground probes. The voltage and pulse durations were taken to be the geometric mean of the pulse reduction and pulse stretching that occurred when two high-speed probes were connected via a 50Ω impedance connection (at 4 K) using nominally identical lines on both sides. This was compared to the pulse output connected directly to a high-speed oscilloscope in order to determine the calibration factor, which was 0.504 reduction in voltage and a lengthening to 242 ps for a nominal 100 ps input pulse. The current was assumed to be that of a 50Ω load driving a short i.e., the current is about twice that of the equivalent voltage driving a 50Ω load. The measured device resistances varied from 1 mΩ to 100 mΩ. Given that the devices have non-zero resistance, the values quoted in the main text represent upper bounds on the currents and thus the energies that were calculated.

Defluxing of superconducting circuits prevents trapped flux due to persistent current loops that can distort the measurements. To remove this potentially trapped flux, the circuits were heated to 9.5 K for 2 min, above the superconducting critical temperature of the junctions and the Nb wiring, and then returned to 4 K for 3 min prior to measurement. The junction critical current was confirmed to be stable after the 3-min cooling wait time. Defluxing was performed after all major changes, such as contacting a device, and after any pulse larger than 100 pJ that occurred in the measurement. The critical current was confirmed to be the same before and after current pulses less than 100 pJ before pulse experiments. In addition, defluxing was also implemented after any field ramping other than in the direct Fraunhofer patters. Field ramps to 20 mT and back were confirmed not to change the value of $I_c$ without the addition of a current pulse. In neuromorphic applications, all of the signal and training pulses are expected to be <<100 pJ and any magnetic fields would be applied locally with a field control line, alleviating any need for in-operando defluxing.

Figure 13:
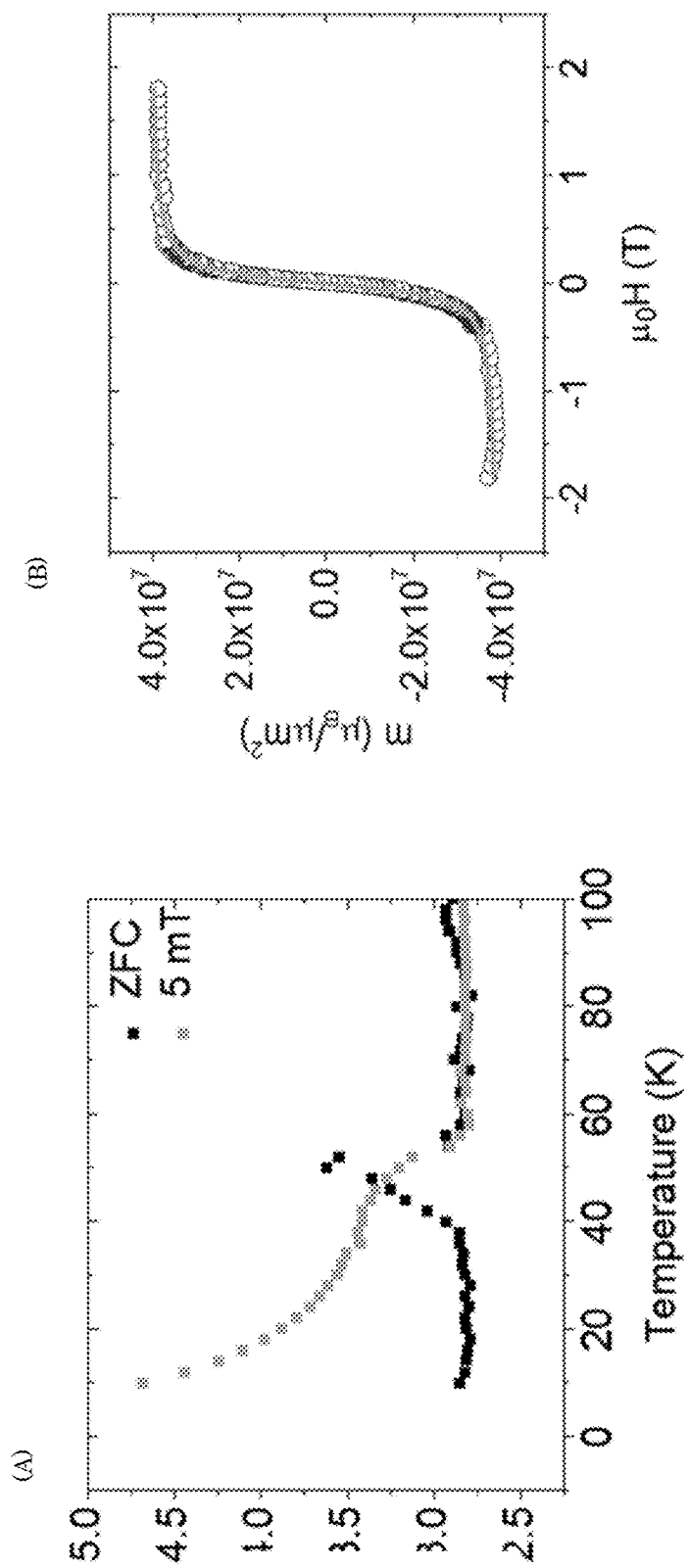
FIG. 13 shows a graph of magnetic moment versus temperature in panel a and a graph of magnetic moment versus magnetic field strength in panel B.

With regard to magnetic barrier properties, control of the magnetic cluster size allows one to vary the amount of energy required to adjust the weight of the artificial synapse. With post deposition annealing or by varying the Si—Mn superlattice spacing, one can tune the cluster size from a large number of net spins per cluster to a small number of net spins per cluster. Characterization of the clustering was done on blanket film stacks using a superconducting quantum interference device (SQUID) magnetometer. The blocking temperature is the temperature below which the net magnetic moments stop fluctuating on the timescale of the magnetometry measurements and gives a measure of the magnetic anisotropy energy, see FIG. 13a. The magnetic anisotropy energy is the energy required to reorient the spin clusters and determines how easy it is to reconfigure the magnetic order of the JJ synapses. The blocking temperature is the point in the graph (FIG. 13a) where there is a maximum in the zero-field-cooled magnetic moment. This temperature also corresponds to the point in the field cooling curve where measured magnetic moments starts to increase with decreasing temperature, which signifies the increase in the net magnetic order. The magnetic JJ synapses presented here were fabricated by sputter deposition of $Nb_{70}$ $(Si_{0.6}Mn_{0.5})\times 3$ $Si_{0.6}Nb_{70}$ where the thicknesses are in nanometers. After deposition, the blanket films were annealed at 400° C. for 10 min in an atmosphere of 5% H in 95% Ar and subsequently patterned using optical lithography. One die from the device wafer was left un-patterned and was used to characterize the nanoclusters using a SQUID magnetometer. FIG. 13a shows the field-cooled and zero-field-cooled data from this witness die. We find that the blocking temperature of our JJ synapses is 52 K±2 K. The size of the Mn nanoclusters can be estimated by measuring the magnetic moment vs. applied magnetic field in the paramagnetic limit, above the blocking temperature. FIG. 13b shows magnetic moment vs. applied field data taken on the same witness die at a temperature of 70 K. We fit the data (blue circles) to the Langevin functions (red line) to estimate that are $2\times 10^4$ Mn clusters per square micrometer, with each cluster having $2000\mu_B\pm 100\mu_B$, where $\mu_B$ is the Bohr magneton. By reducing the cluster size, there is a clear path to reducing the pulse energy required for ordering/disordering the JJ synapses.

Example 2. Energy-Efficient Single-Flux-Quantum Based Neuromorphic Computing

Equations in this Example are numbered independently of other portions of the patent application and begin with Equation 1 below.

Nano-textured magnetic Josephson junctions (MJJs) exhibit tunable spiking behavior with ultra-low training energies in the attojoule range. MJJ devices integrated with standard single-flux-quantum neural systems have spiking energies between $10^{-18}$ J and $10^{-21}$ J, operation frequencies up to 100 GHz, and nanoscale plasticity. Here, neural cells that include MJJs form basic elements in multilayer perception and convolutional networks. We present SPICE models, using experimentally derived Verilog A models for MJJs in neural network structures. Modeling results indicate that the tunable Josephson critical current $I_C$ can function as a weight in a neural network. Using SPICE, we model a fully connected two-layer network with 9 inputs and 3 outputs.

The basic element in single-flux-quantum (SFQ) circuits is the Josephson junction (JJ), which emits a voltage spike with an integrated amplitude equal to the flux quantum ($\varphi_0=2.07\times 10^{-15}$ V·s) when the superconducting order parameter undergoes a $2\pi$ phase slip. These very low energy pulses have been demonstrated in circuits at frequencies well above 100 GHz. Incorporating a nano-textured magnetic barrier into a Josephson junction results in a JJ whose properties can be dynamically changed via currents and magnetic fields. We model neuromorphic circuits based on a combination of traditional SFQ JJs and tunable MJJs.

SFQ circuits have high speed and extremely low operating energies for neuromorphic SFQ circuits. In this case, we model the neuromorphic circuits with WRSPICE a version of SPICE that has integrated support for the physics of SFQ circuits. In addition, we used Verilog A for a physical model of the nano-textured magnetic JJ. This compact model was compiled and integrated with WRSPICE.

The resistively and capacitively shunted junction (RCSJ) model provides a dynamic equation for the phase evolution of a current-biased Josephson junction. A maximum current of $I_C$ may flow as a supercurrent without any voltage developing across the junction. The relationship between superconducting phase and current is given by the Josephson relation: $I=I_C \sin(\varphi)$, where $\varphi$ is the phase difference across the junction. In the voltage state, a quasiparticle current contributes to the total current according to $I=G_N(V) \times V$, where $G_N$ is the junction conductivity and V is the junction voltage. The junction voltage V can be related to the phase by the Josephson voltage-phase relationship $\varphi/dt=2\,eV/\hbar$, where e is the electron charge and $\hbar$ is the reduced Planck's constant. $G_N(V)$ can be strongly voltage-dependent for tunnel junctions or voltage independent for a superconducting-normal-superconducting junction. Here, $G_N(V)$ is assumed to remain constant with voltage for the low resistance junctions in this model. Finally, the displacement current is given by $I=C\,dV/dt$, where C is the junction capacitance, which can again be related to junction phase by the voltage-phase relationship.

The dynamics in the voltage state depend on the Stewart-McCumber parameter as:

$$\beta_C = \frac{2e}{\hbar} I_C R_N^2 C, \quad (1)$$

where $R_N$ is the normal state resistance. This parameter is equal to the squared quality factor, $Q^2$, of a parallel LRC circuit (here, "L" is the small-signal inductance found by linearizing the supercurrent phase-current relationship about the zero-bias phase difference across the junction). The model described in this work uses junctions that are close to critical damping $\beta_C \approx 1$ or overdamped $\beta_C < 1$. For these junctions, a phase evolution in the voltage state followed by a return to the zero-bias phase will cause the junction phase to evolve through one or multiple quantized $2\pi$ phase slips. Each of these $2\pi$ phase slips can be shown by the Josephson phase-voltage relationship to correspond to a voltage pulse of integrated area $\int V(t)dt = h/2e = \Phi_0$. These phase slips define single flux quantum pulses.

We modified the RCSJ model that was outlined above to include a dependence of the superconducting critical current on the magnetic order parameter for our MJJ devices. Physically, in the case of the nano-textured magnetic JJs, the critical current of the junction can be tuned by changing the order of the magnetic clusters. We model this by defining the magnetic order parameter as $$m = \frac{1}{M} \sum_i \vec{m}_i \quad (2)$$

where $\vec{m}_i$ are the moments of each of the magnetic clusters, and M is the total magnetic moment of all clusters in the junction. We define the effect of magnetic order on the junction critical current as:

$$I_C(m, T) = ((1-m)I_{CV} + I_{CM})\left(1 - \left(\frac{T}{T_c}\right)^2\right), \quad (3)$$

where $I_{CV}$ is the variable portion of the critical current, which is influenced by the order of the magnetic particles, $I_{CM}$ is the minimum critical current defined when the barrier has a maximum magnetic order, and $T_c$ is the superconducting transition temperature. The magnetic order parameter varies with the integrated junction voltage according to $dm \propto V(t)dt|E_{pulse} > E_m$ between m=0 and m=1, where $E_{pulse}$ is the pulse energy and $E_m$ is the minimum energy required to change the magnetic order. In other words, a positive voltage pulse across the junction, with enough energy, causes the order parameter to increase and the critical current to decrease up to a saturation point. In the circuits presented here, we set the minimum pulse energy equal to 3 aJ, so that once the weights are set, they are not affected by the operational SFQ pulses.

Figure 14:
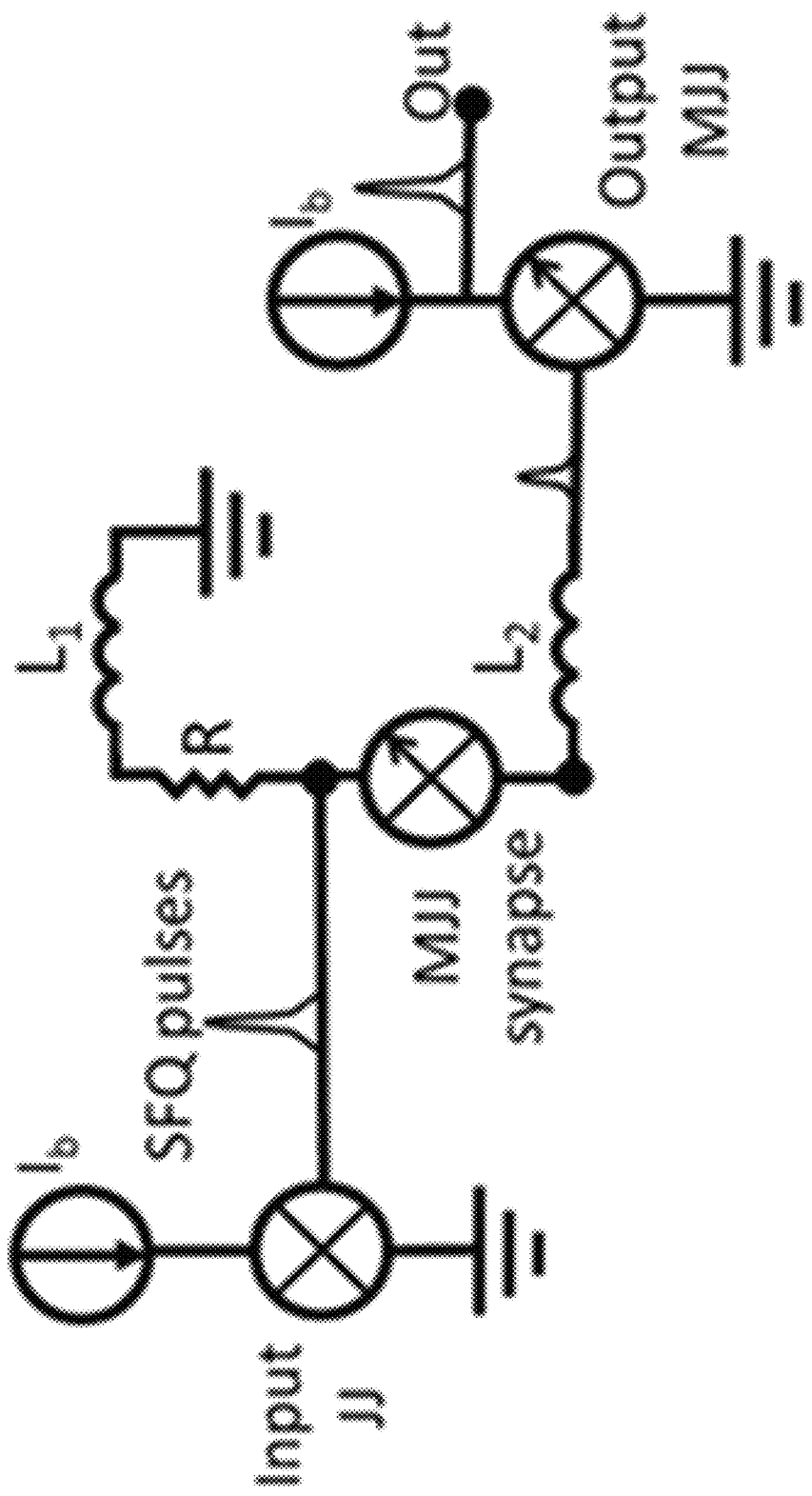
FIG. 14 shows a circuit diagram.

A neuromorphic unit cell can include a neural member. FIG. 14 shows the schematic of the basic neuromorphic unit cell. The JJ on the left side is performing the function of an input "neuron." If the current bias is on, then the junction will spike. The spiking rate of this junction has been tuned to be roughly 0.35 GHz. The JJ in the center is a "synaptic" MJJ which will weight the transmitted pulse from the input "neuron." We adjust the critical current of these junctions between 1 μA and 100 μA to achieve the desired "synaptic" weighting. This adjustment would be accomplished physically by adjusting the magnetic order in the MJJ, something that can be done dynamically in the system. The JJ on the right side of the circuit acts as the output threshold "neuron". This JJ is also an MJJ but with a higher range of critical currents that we can adjust from 100 μA to 500 μA and is thus analogous to the bias of a neural network. Physically, one can adjust the range of the critical currents that the MJJ has by changing the size of the junction. For the case of 1-100 μA currents, devices would be approximately 1 μm in diameter, while MJJs with a critical current range of 5-500 μm can be achieved in MJJs with a diameter of a 3 μm.

The circuit operates when the input DC bias is turned on. At this point the JJ on the left will start firing with a frequency of roughly 0.35 GHz. These pulses are then seen as current pulses by the middle synaptic MJJ. This MJJ will fire with a pulse energy ($I_C \varphi_0/2\pi$) that depends on the critical current of this MJJ. The resistor and inductor above the middle MJJ act to stabilize the circuit by introducing a recovery time between spikes, this acts to desensitize the overall circuit from small reflected pulses. The output JJ has a small constant DC bias that is below the spiking threshold. This JJ will undergo a $2\pi$ phase slip if the pulse transmitted through the middle JJ is large enough. It should be noted that these bias lines can be shared within a layer as the only energy that should be dissipated is the SFQ energy when the input or output spikes. This has previously been shown to allow for extremely low energy operation in energy efficient rapid single flux quantum circuits.

Figure 15:
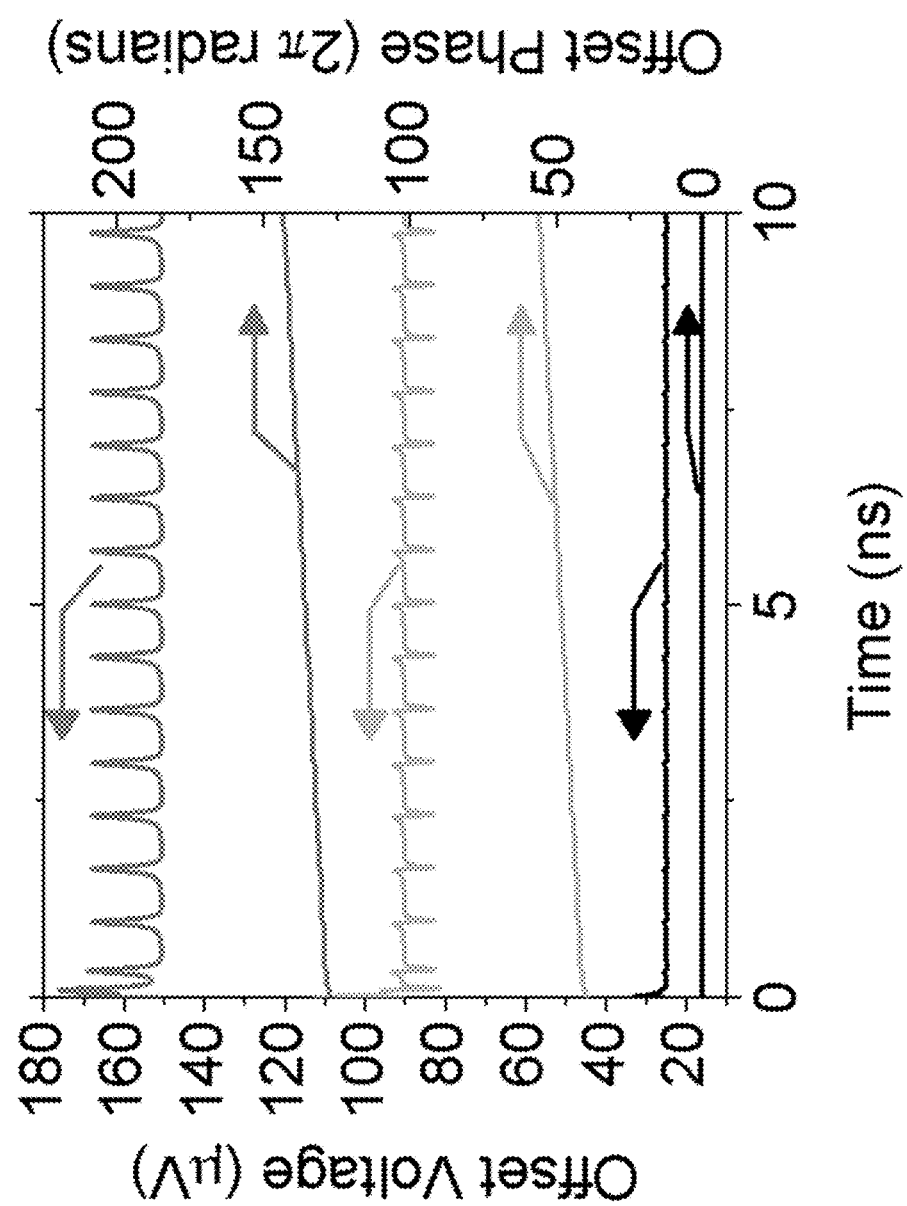
FIG. 15 shows graphs of offset voltage and offset phase versus time.
Figure 16:
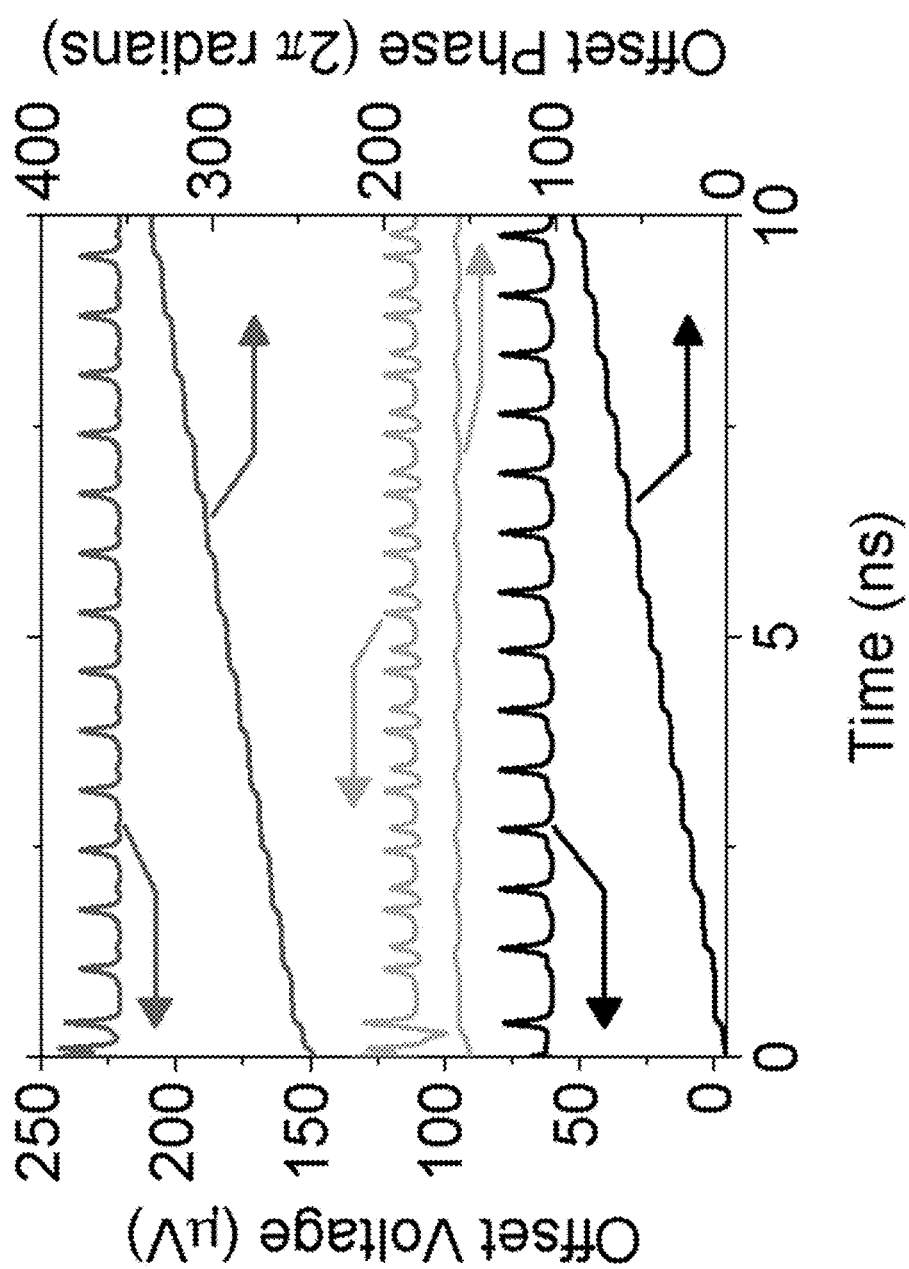
FIG. 16 shows graphs of offset voltage and offset phase versus time.

FIG. 15 and FIG. 16 show the spiking output and phase evolution of the three JJs in the circuit. In FIG. 15, the critical current of the middle MJJ is 10 μA and the output MJJ has an $I_C$=300 μA. As can be seen in the data, the input and middle JJs are spiking, but the output JJ in this configuration is not spiking. In this example, as the middle junction enters the voltage state, it becomes resistive and more of the input current spike is shunted to the ground above the synaptic JJ. In FIG. 16, the middle MJJ has an $I_C$=80 μA and the output MJJ has an $I_C$=300 μA. As can be seen in both the voltage and phase traces, the input and output JJs are firing in this configuration. The weighting JJ in this case is not undergoing $2\pi$ phase slips, but rather is remaining in the superconducting state, and thus passing the initial input pulse through to the output JJ.

In a nine-input pixel, these elements (input JJ, synaptic MJJ, output threshold MJJ) can be used to implement a neural network in hardware. With a 3×3 input pixel array one can define 3 unambiguous letters (z, v, n) and train the neural network to identify these letters and report the answer on one of three outputs. Further, one can add 1 pixel of noise to each of the letters without duplicating patterns that conflate any of the letters. In our example, we use a standard neural network script written in Python to find the weights of a fully connected 9×3 neural network that will be used to solve this example problem. Once the weights are found with the script, we use linear scaling to map these weights to critical current values in the middle layer of the network. In this example, there are only 30 unique input sequences and therefore we use all of the available data for training. As one might expect, we are able to train a standard neural network to reach 100% identification for this example. In addition, by mapping the weights to critical current values, we are also able to get 100% correct identification in the SPICE simulation of our MJJ network.

Figure 17:
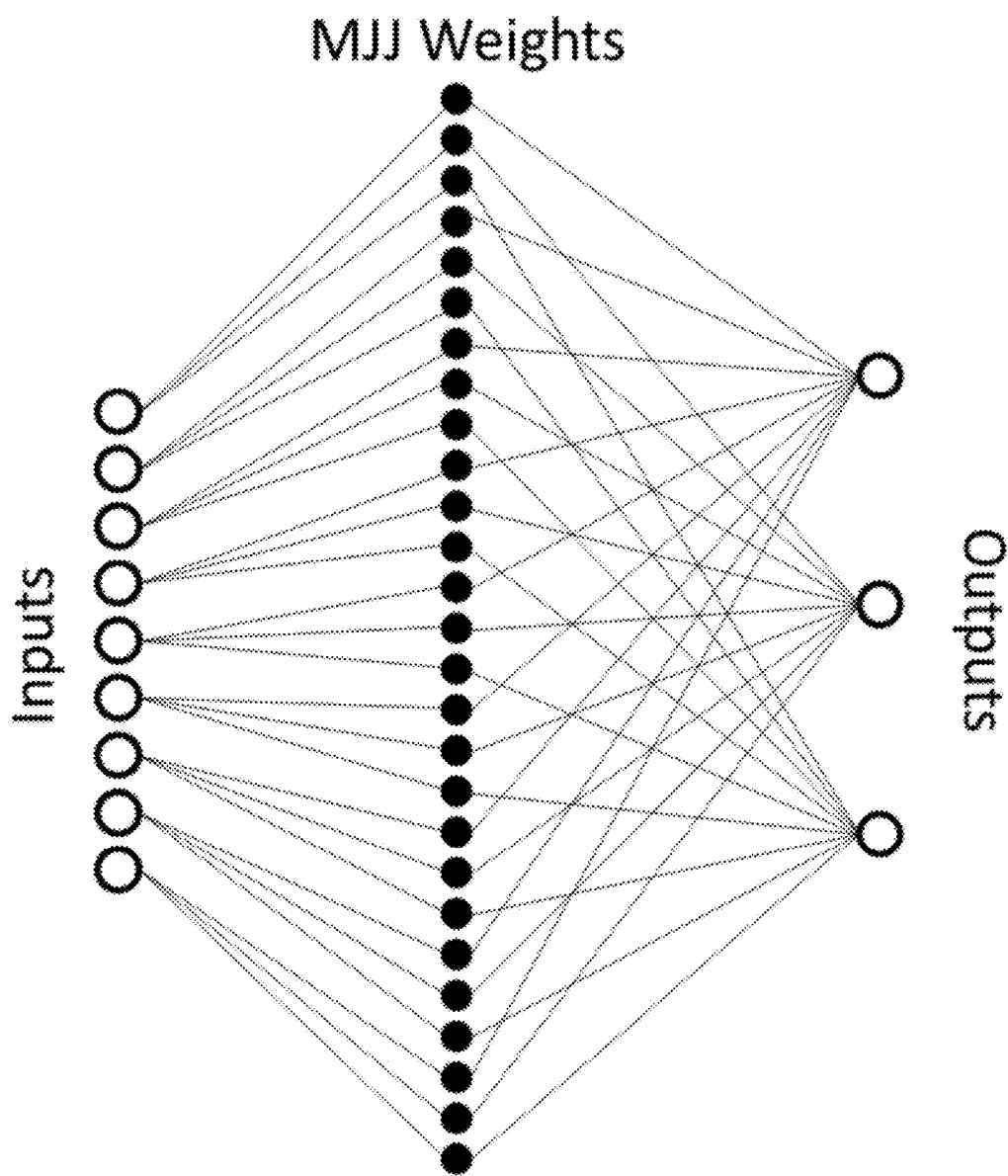
FIG. 17 shows neural network connections.

FIG. 17 shows the circuit diagram for the JJ neural network. There are 9 input JJs each of which has a DC input bias that is either off (0 µA) or on (500 µA). These inputs are connected to 27 synaptic MJJs which have their critical currents adjusted to form the weights of the middle layer. These are then connected to 3 threshold MJJs forming the output layer.

A SPICE simulation of this circuit was run for 89 ns. In this simulation, the input biases were changed every 2.83 ns to a new test case. After 89 ns, the circuit has gone through all 30 test cases. The circuit correctly identifies the input 100% of the time. These results are a promising indication that the circuit could be run in real time for image recognition with input images changing as quickly as every 3 ns in this example.

Figure 18:
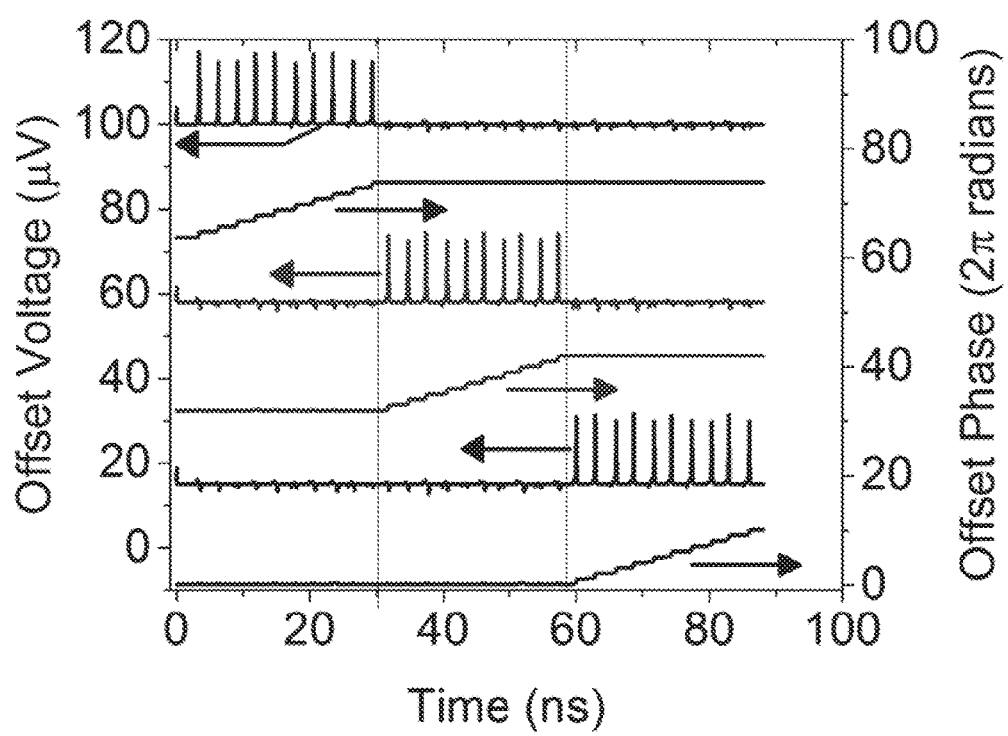
FIG. 18 shows graphs of offset voltage and offset phase versus time.

FIG. 18a shows the results of the 89 ns full input image test. The output pulse state for each of the 3 output MJJ neurons is plotted as a function of time. The pattern input is changing every 2.83 ns to the next image input. The output is shown on the graph. The blue output shows spiking on the "z" output neuron, which correctly spikes with the first 10 input cases of "z" or 1 pixel of noise away from "z". The red output shows the spiking on the "v" output neuron, which correctly spikes with the middle 10 input cases of "v" or one pixel away from "v". The black output shows the spiking on the "n" output neuron, which correctly spikes with the last 10 input cases of "n" or 1 pixel of noise away from "n".

We consider the energy used in this model of spiking JJs by measuring the voltage and current output of each JJ. The value we measure agrees, as expected, with the SFQ pulse energy of $I_C \varphi_0/2\pi$ for each of the JJs. This energy is about 70 zJ for the input JJs, 35 zJ for each of the synaptic JJs and approximately 150 zJ for each of the output JJs. Thus, if we consider only the pulse energies in our network of 39 JJs, this yields an energy dissipation of 2 aJ per classification.

This is not the total energy of the system. In a large-scale implementation, there would be an overhead of approximately 1 kW of cooling power consumed per watt dissipated at 4 K. Such a large-scale implementation would be capable of processing $\sim 10^{18}$ spikes per second in the ideal case where all energy is dissipated only by spike energy. Here, there are two other energy dissipation sources that should be considered. The first is that each of the "neuron" layers is DC biased. Since the bias level is not being changed between JJs, this bias current should be able to be shared with a common line on each layer. The other source of power dissipation that should be considered is the resistor in the RL filter that is used to stabilize the circuit. In the current configuration, this resistor is a source of current dissipation. When the MJJ in the middle layer is firing, this resistor dissipates power that is similar to an additional SFQ pulse energy and is a factor of two loss in spike processing. A quiescent current flows through the resistor in the stabilization element in the present model. The current is a result of the on condition being represented using a constant current. By averaging the current and voltage across this resistor for the entire simulation, we observe a dissipation on this resistor of about 5 pW. This amount of dissipation in a stabilizing element will need to be changed if the networks are going to be implemented on a large scale. A switched input can be used where only one pulse is transmitted for the input on condition. In this case, the resistor can dissipate an additional SFQ pulse energy for energy scaling with the energy accounted for as the input spike energy.

This Example shows a 9-input pixel simulation of a neural network based on a combination of traditional JJs and tunable MJJs. A simple image recognition problem included recognition in the presence of 1 input pixel of noise. Neural network training found the weights and biases mapped to the critical current in the MJJ elements. The total spiking energy for the computation of one input is roughly 2 aJ ($\approx$2 fJ with refrigeration), which is comparable to the energy of a single human synaptic event $\approx$10 fJ. For ultralow power computation, the stabilization resistor can be removed.

Embodiments of the subject matter and the operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions, encoded on a computer storage medium for execution by, or to control the operation of, data processing apparatus. Alternatively, or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more computers executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, can be based on general or special purpose microprocessors or both, workstations, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic; magneto-optical disks, optical disks, USB drives, and so on. However, a computer need not have such devices. Moreover, a computer can be embedded in another device, e.g., a mobile telephone, a personal digital assistant (PDA), a microwave oven, mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The central processing unit and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks). Such interconnects may involve electrical cabling, fiber optics, or be wireless connections.

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. A neural member comprising:
   an axonal superconducting electrode;
   a dendritical superconducting electrode disposed opposing the axonal superconducting electrode;
   a synaptic barrier interposed between the axonal superconducting electrode and the dendritical superconducting electrode and comprising a plurality of magnetic clusters, the synaptic barrier being a tunable magnetic barrier between an ordered magnetic state and a disordered magnetic state such that:
   the axonal superconducting electrode, the dendritical superconducting electrode, and the synaptic barrier are arranged as a dynamically reconfigurable Josephson junction, and
   a ferromagnetic layer interposed between the dendritical superconducting electrode and the synaptic barrier.

2. The neural member of claim 1, wherein the synaptic barrier switches between the ordered magnetic state and the disordered magnetic state in response to an electrical state pulse subjected to the synaptic barrier.

3. The neural member of claim 2, wherein the synaptic barrier switches between the ordered magnetic state and the disordered magnetic state in response to the electrical state pulse in a presence of an applied magnetic field.

4. The neural member of claim 1, further comprising:
   a spacing layer interposed between the ferromagnetic layer and the synaptic barrier.

5. The neural member of claim 4, wherein the neural member is a neural memory cell.

6. The neural member of claim 1, wherein the neural member is an artificial synapse.

7. A neural network comprising:
   the neural member of claim 2; and
   a first electrical pulser in electrical communication with the dendritical superconducting electrode and that provides the electrical state pulse to the dendritical superconducting electrode.

8. The neural network of claim 7, further comprising:
   a second electrical pulser in electrical communication with the axonal superconducting electrode and that receives an electrical action pulse from the axonal superconducting electrode.

9. The neural network of claim 8, further comprising:
   wherein the first electrical pulser and the second electrical pulser independently comprise a Josephson junction or a waveform generator.

10. The neural network of claim 7, further comprising:
    a secondary neural member in electrical communication with the axonal superconducting electrode of the neural member and that receives an electrical output pulse from the axonal superconducting electrode of the neural member.

11. The neural network of claim 10, wherein the secondary neural member has a larger critical current that the neural member.

12. A neurological memory comprising:
    the neural member of claim 4; and
    an electrical current source in electrical communication with the synaptic barrier and that provides a write pulse to the synaptic barrier.

13. The neurological memory of claim 12, further comprising:
    a voltage meter in electrical communication with the synaptic barrier and that reads the magnetic state of the synaptic barrier.

14. A process for training a neural member, the process comprising:

subjecting a synaptic barrier of the neural member to a magnetic field, the synaptic member being in a disordered magnetic state, and the neural member comprising:
- an axonal superconducting electrode;
- a dendritical superconducting electrode disposed opposing the axonal superconducting electrode;
- a synaptic barrier interposed between the axonal superconducting electrode and the dendritical superconducting electrode and comprising a plurality of magnetic clusters, the synaptic barrier being a tunable magnetic barrier between an ordered magnetic state and a disordered magnetic state such that:
- the axonal superconducting electrode, the dendritical superconducting electrode, and the synaptic barrier are arranged as a dynamically reconfigurable Josephson junction;

subjecting the synaptic barrier to a first electrical state pulse;

changing from the disordered magnetic state to an ordered magnetic state in the synaptic barrier in response to the first electrical state pulse in presence of the magnetic field;

maintaining the ordered magnetic state in the synaptic barrier in an absence of the electrical state pulse;

subjecting the synaptic barrier to a second electrical pulse in an absence of the magnetic field; and changing from the ordered magnetic state to the disordered magnetic state in the synaptic barrier in response to the second electrical state pulse in the absence of the magnetic field to train the neural member.

* * * * *